United States Patent
Priest

(10) Patent No.: US 9,986,234 B2
(45) Date of Patent: May 29, 2018

(54) APPARATUSES, METHODS, AND SYSTEMS FOR TROUBLESHOOTING MULTIMEDIA NETWORK COMMUNICATION SYSTEMS

(71) Applicant: Black Diamond Video, Inc., Richmond, CA (US)

(72) Inventor: Edward Priest, Point Richmond, CA (US)

(73) Assignee: Black Diamond Video, Inc., Richmond, CA (US)

( * ) Notice: Subject to any disclaimer, the term of this patent is extended or adjusted under 35 U.S.C. 154(b) by 390 days.

(21) Appl. No.: 14/637,312

(22) Filed: Mar. 3, 2015

(65) Prior Publication Data

US 2015/0256825 A1    Sep. 10, 2015

Related U.S. Application Data

(60) Provisional application No. 61/947,930, filed on Mar. 4, 2014.

(51) Int. Cl.
*H04L 12/28*     (2006.01)
*H04N 17/04*     (2006.01)
*H04L 12/26*     (2006.01)
*H04B 3/46*      (2015.01)
*G01R 31/04*     (2006.01)

(52) U.S. Cl.
CPC ............ *H04N 17/04* (2013.01); *H04B 3/46* (2013.01); *H04L 43/0811* (2013.01); *H04L 43/50* (2013.01); *G01R 31/04* (2013.01); *H04N 2201/0005* (2013.01); *H04N 2201/3267* (2013.01)

(58) Field of Classification Search
None
See application file for complete search history.

(56) References Cited

U.S. PATENT DOCUMENTS

| | | | |
|---|---|---|---|
| 6,411,623 B1 * | 6/2002 | DeGollado | H04L 43/50 348/E17.003 |
| 6,785,362 B1 * | 8/2004 | Van Der Gouwe | H04M 3/323 379/1.01 |
| 2002/0087908 A1 * | 7/2002 | Dossey | G06F 1/28 713/340 |

(Continued)

*Primary Examiner* — Christopher T Wyllie
(74) *Attorney, Agent, or Firm* — Loza & Loza LLP; Razmig Messerian

(57) ABSTRACT

One feature pertains to an apparatus that includes a first communication interface, a second communication interface adapted to transmit and/or receive multimedia data signals to and/or from a device through a wired connection, and a memory circuit adapted to store instructions for conducting one or more wired connection integrity tests. The wired connection integrity tests determine at least whether the apparatus is able to communicate with the device. The apparatus further includes a processing circuit adapted to initiate the one or more wired connection integrity tests by executing the instructions stored in the memory circuit, determine whether each of the one or more wired connection integrity tests initiated passed or failed, and report whether the one or more wired connection integrity tests passed or failed. The wired connection integrity tests may include signal line communication tests, cable integrity and quality tests, and data or video test pattern tests.

20 Claims, 13 Drawing Sheets

(56) References Cited

U.S. PATENT DOCUMENTS

| | | | | |
|---|---|---|---|---|
| 2004/0165595 A1* | 8/2004 | Holmgren | ............ | H04L 12/4641 |
| | | | | 370/395.3 |
| 2004/0201382 A1* | 10/2004 | Spies | ................... | H04M 3/323 |
| | | | | 324/538 |
| 2006/0109348 A1* | 5/2006 | Lee | ....................... | H04N 17/04 |
| | | | | 348/180 |
| 2006/0203227 A1* | 9/2006 | Unger | .................... | G01R 27/28 |
| | | | | 356/73.1 |
| 2008/0304824 A1* | 12/2008 | Barbieri | ............ | H04B 10/0793 |
| | | | | 398/38 |
| 2009/0074153 A1* | 3/2009 | Wu | ....................... | H04M 3/306 |
| | | | | 379/1.04 |

\* cited by examiner

APPARATUSES, METHODS, AND SYSTEMS FOR TROUBLESHOOTING MULTIMEDIA NETWORK COMMUNICATION SYSTEMS

CLAIM OF PRIORITY

The present application for patent claims priority to U.S. provisional application No. 61/947,930 entitled "Video Data Port Apparatus" filed Mar. 4, 2014, the entire disclosure of which is hereby expressly incorporated by reference.

BACKGROUND

Field

Various features generally relate to multimedia network communication systems, and in particular to apparatuses, methods, and systems for troubleshooting multimedia network communication systems.

Background

Multimedia systems typically include many different complex components including video sources, audio sources, video routers, audio routers, servers, displays, speakers, etc. all interconnected through a myriad of cables and connections. Given this level of complexity, it is all but inevitable that at some point part or all of the multimedia system may fail to function correctly. For example, a person passing through the room may accidentally disconnect a communication wire from one of the video sources. Alternatively, moisture may enter the sensitive electronic components within a display device. Each of these mishaps and issues may cause parts of the system to fail.

Troubleshooting such multimedia systems is no simple task. Often, a service engineer or technician is called in to physically service the system by inspecting, identifying, and fixing the one or more problems. Identifying the root of a given problem may be time consuming. For example, a user of the multimedia system may notice that one of the displays is not displaying the proper source video image. This may be caused by numerous different reasons: the cable connection connecting the display to the video router may be bad or disconnected; the cable connection from the video source to the video router may bad or disconnected; the video source may be powered OFF; the video router may not be programmed correcting, etc. The technician may have to painstakingly swap cables and check through the various issues one by one until the real root of the problem is identified. Troubleshooting such multimedia systems in this manner is prohibitively time consuming and expensive.

There is a need for improved apparatuses, methods, and systems for troubleshooting multimedia systems.

SUMMARY

One feature provides an apparatus comprising a first communication interface, a second communication interface adapted to transmit and/or receive multimedia data signals to and/or from a device through a wired connection, a memory circuit adapted to store instructions for conducting one or more wired connection integrity tests, the wired connection integrity tests determining at least whether the apparatus is able to communicate with the device, and a processing circuit communicatively coupled to the first and second communication interfaces and the memory circuit. The processing circuit is adapted to initiate the one or more wired connection integrity tests by executing the instructions stored in the memory circuit, determine whether each of the one or more wired connection integrity tests initiated passed or failed, and report whether the one or more wired connection integrity tests passed or failed. According to one aspect, the one or more wired connection integrity tests include a signal line communication (SLC) test that determines whether the apparatus and the device are able to establish bi-directional communications with each other, and the processing circuit is further adapted to initiate the SLC test, transmit a SLC test request message to the device, determine that the SLC test passed if a SLC test acknowledgement message is received in response to the SLC test message from the device within a predefined period of time, otherwise determine that the SLC test failed, and report whether the SLC test passed or failed. According to another aspect, the one or more wired connection integrity tests include a cable integrity and quality (CIQ) test that determines whether there exists at least one of (a) an increase in power loss associated with the wired connection, and/or (b) a power loss value associated with the wired connection exceeds a predefined threshold value.

According to one aspect, the one or more wired connection integrity tests include a cable integrity and quality (CIQ) test, and the processing circuit is further adapted to generate a first test sequence, transmit the first test sequence to the device through the wired connection, receive a second test sequence, determine a transmit power of the first test sequence and receive power of the second test sequence, receive a transmit power of the second test sequence and a receive power of the first test sequence from the device, determine one or more power loss values associated with the wired connection based on the transmit power of the first test sequence, the receive power of the first test sequence, the transmit power of the second test sequence, and the receive power of the second test sequence, and determine whether the one or more power loss values exceeds a predefined threshold value and if so then report a CIQ test failed message. According to another aspect, the CIQ test failed message is reported to at least one of (a) a server and video router (SVR) communicatively coupled to the apparatus and/or the device, and/or (b) a remote server communicatively coupled to the SVR through a communication network. According to yet another aspect, the processing circuit is further adapted to compare the one or more power loss values to stored power loss values generated during prior CIQ tests, and determine whether the one or more power loss values is indicative of a greater power loss through the wired connection than the stored power loss values generated during prior CIQ tests.

According to one aspect, the one or more wired connection integrity tests include a video test pattern test that determines whether the device is accurately receiving video data signals from the apparatus through the wired connection. According to another aspect, the processing circuit is further adapted to transmit a video test pattern (VTP) request message to the device indicating a specific video test pattern is requested, receive a device-generated video test pattern from the device through the wired connection, obtain an apparatus-generated video test pattern that is generated at the apparatus based on the specific video test pattern requested, compare the device-generated video test pattern received to the apparatus-generated video test pattern, determine a match value indicative of how closely the device-generated video test pattern received matches the apparatus-generated video test pattern, and report a video test pattern failed message if the match value is less than a predefined threshold value. According to yet another aspect, the video test pattern test includes a video test pattern, and the first communication interface is adapted to transmit the video test pattern to a display device where the video test pattern can be visually inspected on the display device to determine whether the display device is accurately received video signals from the apparatus.

According to one aspect, the first communication interface is adapted to receive a first multimedia data signal from at least one of a multimedia data source and/or a multimedia data converter, and the second communication interface is adapted to transmit a second multimedia data signal to the device, the second multimedia data signal based on the first multimedia data signal. According to another aspect, the second communication interface is adapted to receive a first multimedia data signal from the device, and the first communication interface is adapted to transmit a second multimedia data signal to a multimedia destination device, the second multimedia data signal based on the first multimedia data signal. According to yet another aspect, the apparatus further comprises an input device adapted to receive a selection from a user, one or more light emitting diode (LED) status indicators, and wherein the processing circuit is further adapted to initiate the one or more wired connection integrity tests after receiving the selection from the input device, and report whether the one or more wired connection integrity tests passed or failed by illuminating the one or more LED status indicators.

According to one aspect, the processing circuit is further adapted to receive a command from a server and video router (SVR) and/or a remote server that initiates the one or more wired connection integrity tests, and report whether the one or more wired connection integrity tests passed or failed to the SVR and/or the remote server. According to another aspect, the one or more wired connection integrity tests are initiated according to a predefined schedule.

Another feature provides a system comprising a Transmit (Tx) port, a Receive (Rx) port, a wired connection communicatively coupling the Tx port to the Rx port and allowing bi-directional communication between the Tx port and the Rx port, and wherein the Tx port and the Rx port are each adapted to initiate one or more wired connection integrity tests, the wired connection integrity tests determining at least whether the Tx port and the Rx port can communicate with one another, determine whether each of the one or more wired connection integrity tests initiated passed or failed, and report whether the one or more wired connection integrity tests passed or failed. According to one aspect, the one or more wired connection integrity tests include a signal line communication (SLC) test that determines whether the Tx port and the Rx port are able to establish bi-directional communications with each other, and at least one of the Tx port and/or the Rx port is adapted to initiate the SLC test, transmit a SLC test request message, determine that the SLC test passed if a SLC test acknowledgement message is received in response to the SLC test message within a predefined period of time, otherwise determine that the SLC test failed, and report whether the SLC test passed or failed. According to another aspect, the one or more wired connection integrity tests include a cable integrity and quality (CIQ) test that determines whether there exists at least one of (a) an increase in power loss associated with the wired connection, and/or (b) a power loss value associated with the wired connection exceeds a predefined threshold value.

According to one aspect, the one or more wired connection integrity tests include a video test pattern test that determines whether the Rx port is accurately receiving video data signals from the Tx port through the wired connection. According to another aspect, the Rx port is further adapted to transmit a video test pattern (VTP) request message to the Tx port indicating a specific video test pattern is requested, receive a Tx port-generated video test pattern from the Tx port through the wired connection, obtain an Rx port-generated video test pattern that is generated at the Rx port based on the specific video test pattern requested, compare the Tx port-generated video test pattern received to the Rx port-generated video test pattern, determine a match value indicative of how closely the Tx port-generated video test pattern received to the Rx port-generated video test pattern, and report a video test pattern failed message if the match value is less than a predefined threshold value.

According to one aspect, the Tx port is adapted to receive a first multimedia data signal from at least one of a multimedia data source and/or a multimedia data converter, and the Rx port is adapted to transmit a second multimedia data signal to a video router that is communicatively coupled to the Rx port, the second multimedia data signal based on the first multimedia data signal. According to another aspect, the Tx port is adapted to receive a first multimedia data signal from a video router that is communicatively coupled to the Tx port, and the Rx port is adapted to transmit a second multimedia data signal to a multimedia destination device, the second multimedia data signal based on the first multimedia data signal.

Another feature provides a method operational at a first port, the method comprising initiating one or more wired connection integrity tests at the first port by executing instructions stored at a memory circuit of the first port, the wired connection integrity tests determining at least whether the first port can communicate bi-directionally with a second port over a wired connection, determining whether each of the one or more wired connection integrity tests initiated passed or failed, and reporting whether the one or more wired connection integrity tests passed or failed to at least one of the second port, a server, a video router, and/or a remote server communicatively coupled to the server.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits and structures may be shown in block diagrams in order to avoid obscuring the aspects in unnecessary detail. In other instances, well-known circuits, structures and techniques may not be shown in detail in order not to obscure the aspects of the disclosure. The word "exemplary" is used herein to mean "serving as an example, instance, or illustration." Any implementation or aspect described herein as "exemplary" is not necessarily to be construed as preferred or advantageous over other aspects of the disclosure.

Exemplary Multimedia Network Communication System

Figure 1:
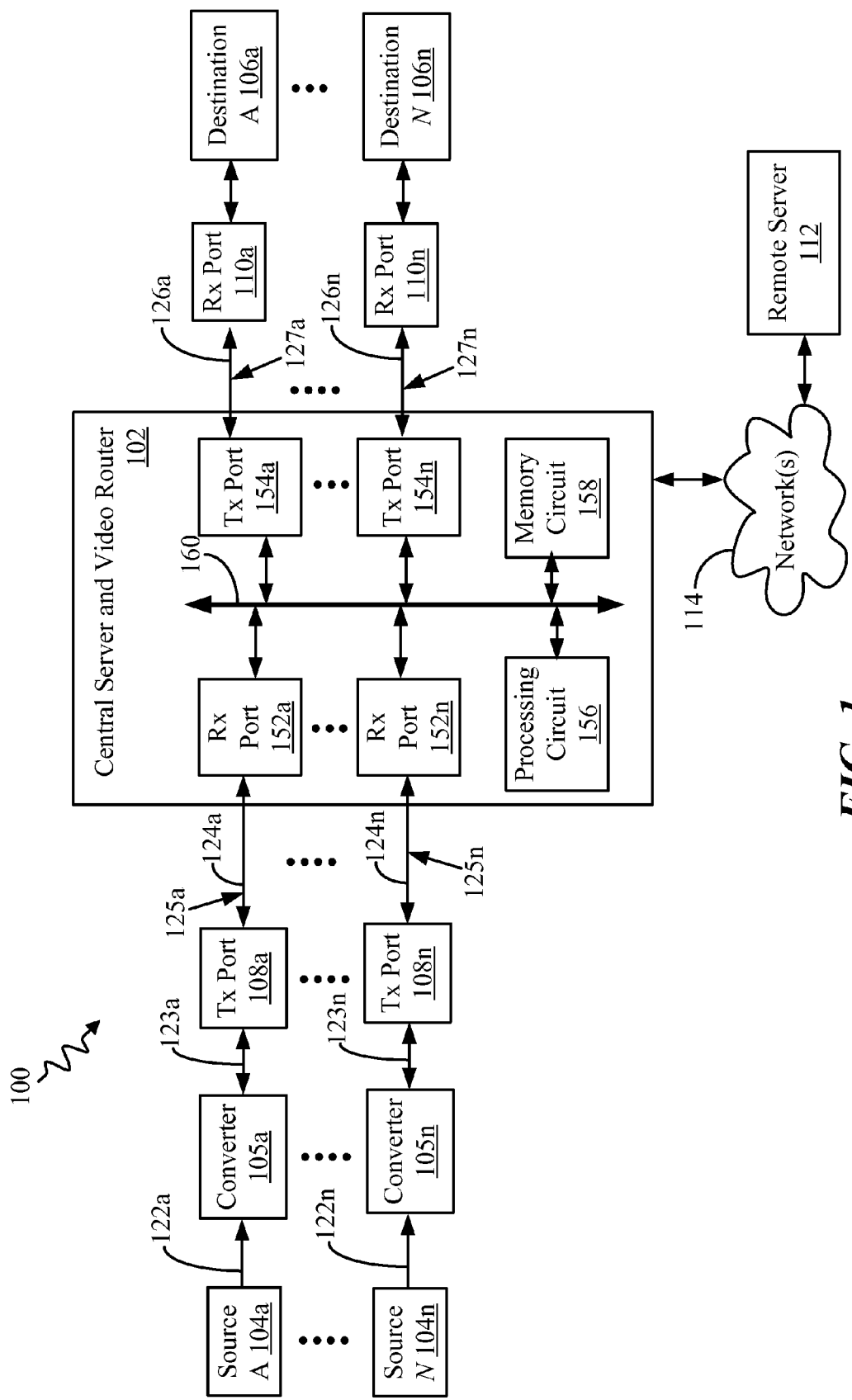
FIG. 1 illustrates a high-level schematic block diagram of a first exemplary multimedia network communication system.

FIG. 1 illustrates a high-level schematic block diagram of a multimedia network communication system 100 according to one aspect of the disclosure. The system 100 may be implemented in a variety of settings and applications that utilize high speed transmission of multimedia signals (e.g., audio, video, and other data signals) between networked components. Examples of such settings and applications include, but are not limited to, command and control rooms, surgical suites, operating rooms, hybrid operating room suites, catheterization laboratories, electrophysiology laboratories, pathology laboratories, magnetic resonance imaging suites, cardiac suites, conference rooms, etc.

The system 100 may include a central server and video router 102, a plurality of multimedia data sources 104a . . . 104n (e.g., N number of sources), a plurality of destinations 106a . . . 106n (e.g., N number of destinations), a plurality of multimedia data converters 105a . . . 105n (e.g., N number of converters), a plurality of standalone transmitter (Tx) ports 108a . . . 108n (e.g., N number of Tx ports), a plurality of standalone receiver (Rx) ports 110a . . . 110n (e.g., N number of Rx ports), and/or a remote server 112. The central server and video router 102 may include a plurality of integrated Rx ports 152a . . . 152n (e.g., N number of Rx ports), a plurality of integrated Tx ports 154a . . . 154n (e.g., N number of Tx ports), a processing circuit 156 (e.g., processor, central processing unit (CPU), etc.), and a memory circuit 158. The integrated Rx and Tx ports 152a . . . 152n, 154a . . . 154n, the processing circuit 156, and/or the memory circuit 158 may be communicatively coupled to one another through a communication bus 160.

The multimedia sources 104a . . . 104n generate and/or provide multimedia data that may include audio, video, and/or other data signals. Examples of sources 104a . . . 104n include, but are not limited to, video cameras, cameras, microphones, endoscopes, microscopes, x-ray machines, fluoroscopes, C-arms, surgical cameras, surgical robots, multimedia data storage devices, servers, etc. One or more multimedia sources 104a . . . 104n may couple to and output their multimedia data signals 122a . . . 122n to the data converters 105a . . . 105n. The data converters 105a . . . 105n convert the incoming multimedia data signals 122a . . . 122n from a first signal type (e.g., digital visual interface (DVI), RS232, high definition multimedia interface (HDMI®), S-video, RCA, $YP_BP_R$, etc.) to a second all digital signal type (high speed serializer/deserializer (SERDES), Display Port, DVI, HDMI®, serial digital interface (SDI), high-definition serial digital interface (HD-SDI), 3G-SDI, 6G-SDI, 12G-SDI, etc.). The data converters 105a . . . 105n output converted (e.g., second signal type) multimedia data signals 123a . . . 123n that are then input to the plurality of standalone Tx ports 108a . . . 108n. The converted multimedia data signals 123a . . . 123n may be transmitted to the Tx ports 108a . . . 108n over a wired connection such as electrical conductor based lines (e.g., category 5 (cat5), category 5 enhanced (cat5e), category 6 (cat6), etc.) or fiber optic communication lines. In an alternative aspect of the disclosure, the multimedia data signals 122a . . . 122n are output from the sources 104a . . . 104n directly to the plurality of Tx Ports 108a . . . 108n, which perform the conversion from the first signal type to the second signal type.

The Tx ports 108a . . . 108n receive the converted multimedia data signals 123a . . . 123n (or original multimedia data signals 122a . . . 122n) and output multimedia signal data 124a . . . 126n. In one aspect, the outputted multimedia signal data 124a . . . 126n may be the same converted multimedia data signals 123a . . . 123n received (or original multimedia data signals 122a . . . 122n). In another aspect, the outputted multimedia signal data 124a . . . 126a is data that has been further converted by the Tx ports 108a . . . 108n into a third signal type such as a digital serial signal type (e.g., high speed SERDES signal). Each Tx port 108a . . . 108n may have multiple input ports to receive separate multimedia data signals 122a . . . 122n from different sources 104a . . . 104n or converted multimedia data signals 123a . . . 123n from the data converters 105a . . . 105n. According to one aspect, the Tx ports 108a . . . 108n include two (2) input ports for receiving separate multimedia data signals from two different sources 104a . . . 104n and/or data converters 105a . . . 105n.

In one aspect, the multimedia signal data 124a . . . 124n is transmitted to the central server and video router 102 over a wired connection 125a . . . 125n. The wired connections 125a . . . 125n may include electrical conductor-based wired connections or fiber optic-based wired connections that transmit data using light. Some non-limiting, non-exclusive examples of electrical conductor-based wired connections include coaxial cables, twisted pair cabling such as, but not limited to, cat5, cat5e, and cat6 cables. In another aspect, the multimedia signal data 124a . . . 124n may be transmitted wirelessly to the central server and video router 102.

The Tx ports 108a . . . 108n may also receive data and commands from the integrated Rx ports 152a . . . 152n and/or the remote server 112 over the wired connections 125a . . . 125n. As explained in greater detail below these commands may initiate signal integrity testing by the Tx ports 108a . . . 108n to verify functionality of the Tx ports 108a . . . 108n and transmission signal integrity and quality over the wired connections 125a . . . 125n.

The central server and video router (SVR) 102 performs a variety of different operations. For example, the SVR 102 routes multimedia data signals from the plurality of sources 104a . . . 104n to the plurality destinations 106a . . . 106n (via the data converters 105a . . . 105n, Tx ports 108a . . . 108n, and Rx ports 110a . . . 110n). This includes routing video signal data from the sources 104a . . . 104n to the destinations 106a . . . 106n, which may be display devices. The SVR 102 may also host a network control application (e.g., resident on the memory circuit 158 and executed by the processing circuit 156) that allows a user to control various aspects of the system 100 including the routing assignments of multimedia signal data between sources 104a . . . 104n and destinations 106a . . . 106n. According to one aspect, the SVR 102 may execute the Integrated Digital Surgical Suite (IDSS)™ software series developed by Black Diamond Video Inc. located at 503 Canal Blvd. Richmond, Calif. 94804. As explained in greater detail below, the SVR 102 may also issue commands that cause the standalone Tx ports 108a . . . 108n and integrated Tx ports 154a . . . 154n to initiate signal integrity testing. The SVR 102 may also be communicatively coupled to at least one remote server 112 through one or more local area and/or wide area networks 114.

The SVR 102 may include a plurality of integrated Rx ports 152a . . . 152n. The Rx ports 152a . . . 152n receive multimedia signal data 124a . . . 124n over the wired connections 125a . . . 125n from the plurality of Tx ports 108a . . . 108n. As explained in greater detail below, the Rx ports 152a . . . 152n may transmit commands that cause the standalone Tx ports 108a . . . 108n to initiate signal integrity testing. The Rx ports 152a . . . 152n may also analyze data associated with the signal integrity testing that is received from the Tx ports 108a . . . 108n to determine various signal integrity metrics including whether one or more signal integrity tests passed or failed.

The SVR 102 may also include a plurality of integrated Tx ports 154a . . . 154n. The integrated Tx ports 154a . . . 154n may transmit multimedia signal data 126a . . . 126n received at the integrated Rx ports 152a . . . 152n to the standalone Rx ports 110a . . . 110n over/through a plurality of wired connections 127a . . . 127n (N number of wired connections). The wired connections 127a . . . 127n may include electrical conductor-based wired connections or fiber optic-based wired connections that transmit data using light. Some non-limiting, non-exclusive examples of electrical conductor-based wired connections include coaxial cables, twisted pair cabling such as, but not limited to, cat5, cat5e, and cat6 cables. As one non-limiting, non-exclusive example, the multimedia signal data 126a . . . 126n may be transmitted to the standalone Rx ports 110a . . . 110n using HDBaseT® over twisted pair cabling (e.g., cat5e, cat6). The integrated Tx ports 154a . . . 154n may also receive data and commands from the standalone Rx ports 110a . . . 110n, the SVR's processing circuit 156, and/or the remote server 112. As explained in greater detail below these commands may initiate signal integrity testing by the integrated Tx ports 154a . . . 154n to verify functionality of the integrated Tx ports 154a . . . 154n and transmission signal integrity and quality over the wired connections 127a . . . 127n.

The standalone Rx ports 110a . . . 110n receive multimedia signal data 126a . . . 126n over the wired connections 127a . . . 127n from the plurality of integrated Tx ports 154a . . . 154n. Like the integrated Rx ports 152a . . . 152n, the standalone Rx ports 110a . . . 110n may transmit commands that cause the integrated Tx ports 154a . . . 154n to initiate signal integrity testing. The standalone Rx ports 110a . . . 110n may also analyze data associated with the signal integrity testing that is received from the Tx ports 154a . . . 154n to determine various signal integrity metrics including whether one or more signal integrity tests passed or failed.

In the illustrated example, the standalone Rx ports 110a . . . 110n are dongles that are communicatively coupled 128a . . . 128n to the destination devices 106a . . . 106n. However, in other aspects of the disclosure, the Rx ports 110a . . . 110n may be integrated within the destination devices 106a . . . 106n. For example, if the destination device 106a is a display device, it may include a front end comprising the Rx port 110a.

The destination devices 106a . . . 106n may be display devices (e.g., monitors, televisions, flat panel displays including liquid crystal displays (LCDs), displays featuring high definition (HD), ultra-high definition (UHD) 4K, UHD 8K, etc.), speakers, projectors, smartphones, laptops, personal computers, and/or other devices that can receive a media signal input and output light and/or sound. The destination devices 106a . . . 106n may output the multimedia signal data generated at the sources 104a . . . 104n.

The remote server 112 may be communicatively coupled to the SVR 102, the sources 104a . . . 104n, the standalone Tx ports 108a . . . 108n, the standalone Rx ports 110a . . . 110n, and/or the destination devices 106a . . . 106n through the network 114. As discussed above, the network 114 may be a local area network and/or a wide area network. The network 114 may include both wireless and wired network topologies and components. According to one aspect, the network 114 may include the internet. The remote server 112 may be associated with a support team tasked with maintaining and troubleshooting the system 100. As such the remote server 112 may receive signal integrity test results from the various components of the system 100.

Exemplary Tx Port

Figure 2:
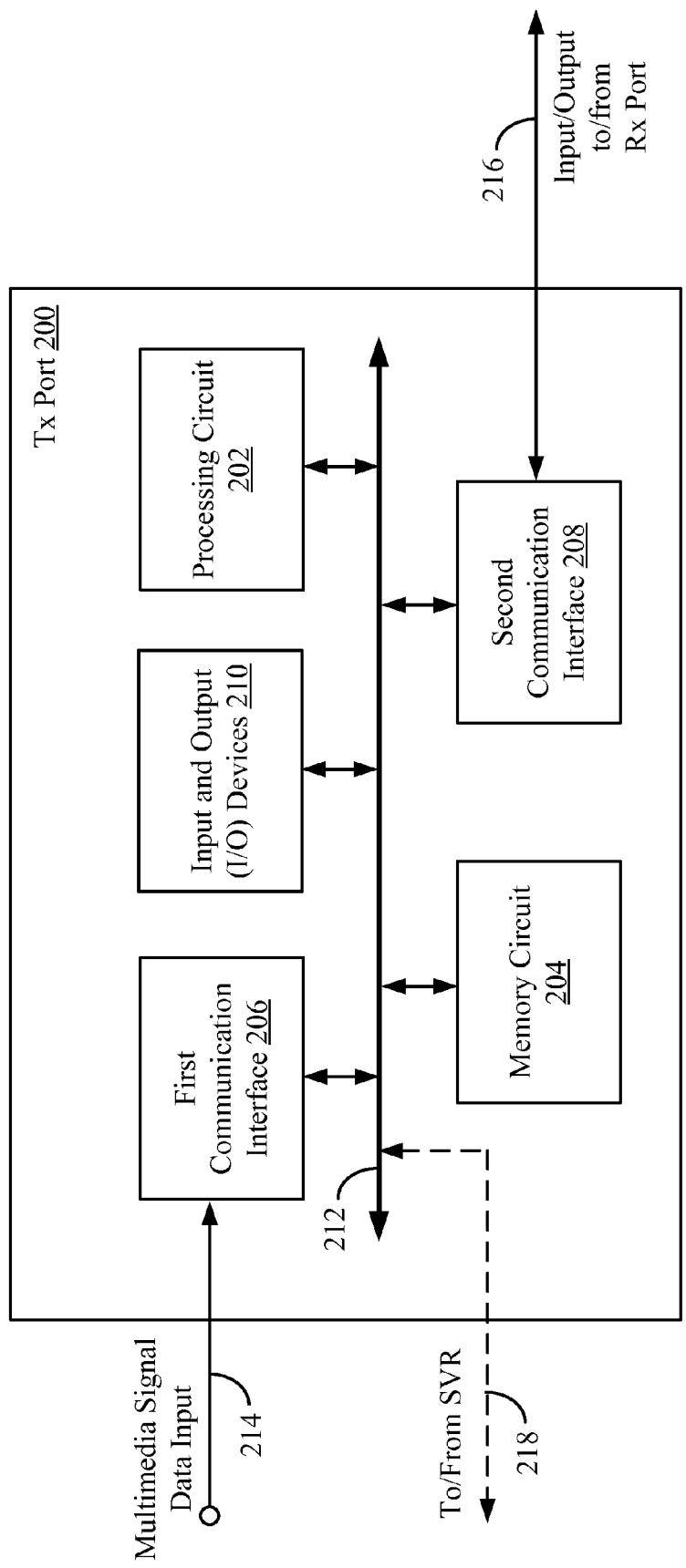
FIG. 2 illustrates a first exemplary schematic block diagram of a Tx port.

FIG. 2 illustrates a schematic block diagram of a Tx port 200 according to one aspect of the disclosure. The Tx port 200 shown in FIG. 2 may represent any one of the standalone Tx ports 108a . . . 108n and/or the integrated Tx ports 154a . . . 154n of FIG. 1. Referring to FIG. 2, the Tx port 200 may include at least one processing circuit 202 (e.g., processor(s), application specific integrated circuit(s) (ASICs), field programmable gate array(s) (FPGAs)), at least one memory circuit 204, a first communication interface 206, a second communication interface 208, and/or input and output (I/O) devices 210. According to one non-limiting, non-exclusive example, the processing circuit 202, the memory circuit 204, the first communication interface 206, the second communication interface 208, and/or the I/O devices 210 may be communicatively coupled together through a communication bus 212. In other examples, the Tx port components 202, 204, 206, 208, 210 may be communicatively coupled through direct and/or indirect signal lines running between them. The Tx port 200 (e.g., the communication bus 212) may also be communicatively coupled (see data path 218) to the SVR 102 in the case where the Tx port 200 is integrated within the SVR 102.

The first communication interface 206 receives multimedia data signals 214. For example, referring to FIGS. 1 and 2, the first communication interface 206 may receive such multimedia data signals 214 indirectly from the multimedia data sources 104a . . . 104n (video cameras, cameras, microphones, endoscopes, microscopes, x-ray machines, etc.) via data converters 105a . . . 105n. According to another example, the first communication interface 206 may receive multimedia data signals 214 directly from the multimedia data sources 104a . . . 104n. In the case where the Tx port 200 is integrated within the SVR 102, the multimedia data signals 214 may come from the integrated Rx ports 152a . . . 152n. The first communication interface 206 may be designed to support and receive data according to a first signal type such as, but not limited to, DVI, RS232, HDMI, Display Port, S-video, RCA, $YP_BP_R$, HDBaseT®, etc.

The memory circuit 204 may include volatile (e.g., static random access memory (SRAM), dynamic random access memory (DRAM), synchronous dynamic random access memory (SDRAM), etc.) and non-volatile memory (e.g., flash memory, read only memory, magnetoresistive memory (MRAM), ferromagnetic memory (FRAM), etc.). The memory circuit 204 may generally store instructions that are executed by the processing circuit 202. Specifically, the memory circuit 204 may store, among other things, instructions that are used to generate one or more data test patterns, one or more video test patterns, and other instructions that execute algorithms used during signal integrity testing.

The I/O devices 210 may include one or more buttons that initiate signal integrity testing, reset the Tx port 200, power ON/OFF the Tx port 200, and/or control multimedia signal data conversion. The I/O devices 210 may also include status light emitting diode (LED) indicators that light up and/or blink to indicate different statuses of the Tx port 200. Non-exhaustive examples of these statuses may indicate whether the Tx port 200 is powered ON/OFF, receiving an input signal, able to transmit an output signal, signal integrity testing passed or failed, various types of errors, etc.

The second communication interface 208 transmits multimedia signal data 216 to a corresponding Rx port over a wired connection (e.g., wired connections 125a . . . 125n, 127a . . . 127n in FIG. 1). The second communication interface 208 may be designed to support and transmit data according to a second signal type such as, but not limited to, DVI, RS232, HDMI, Display Port, S-video, RCA, $YP_BP_R$, HDBaseT®, high speed SERDES, etc., which may be different than or the same as the first signal type received at the first communication interface 206. Referring to FIGS. 1 and 2, the second communication interface 208 also receives data and commands 216 from the corresponding Rx port over the wired connection 125a . . . 125n, 127a . . . 127n. These commands may initiate signal integrity testing by the Tx port 200 to verify functionality of the Tx port 200 and transmission signal integrity and quality over the wired connections 125a . . . 125n, 127a . . . 127n.

Among other things, the processing circuit 202 receives the data and commands via the second communication interface 208 to initiate signal integrity testing at the Tx port 200. The processing circuit 202 may analyze the data received from the Rx port to determine whether cable connection 125a . . . 125n, 127a . . . 127n coupling the Tx port 200 to the Rx port appears functional at a minimum level where at least some data can be passed through and the two ports can communicate in a timely manner. The processing circuit 202 may transmit back a message to the Rx port so that the Rx port can also determine that the cable connection 125a . . . 125n, 127a . . . 127n appears functional enough to allow for communication between the two ports. In one case, the message that is transmitted back by the processing circuit 202 may simply be an acknowledgement message that it has received the data transmitted by the Rx port.

The processing circuit 202 may also retrieve the instructions associated with data test patterns and video test patterns stored at the memory circuit 204. The instructions retrieved may be executed by the processing circuit 202 to generate data test patterns and/or video test patterns. The data test patterns and/or video test patterns may be transmitted to an Rx port via the second communication interface 208 and the wired connections 125a . . . 125n, 127a . . . 127n. The data test patterns consist of preset data signals and the video test patterns consist of preset video signals that the Rx port receives and compares to a known set of data and video test patterns it has stored internally to determine whether the received data and/or video test pattern substantially match the patterns stored. Any substantial variation between the received test pattern and the stored, known test pattern at the Rx port may be attributed to a faulty or degraded wired connection 125a . . . 125n, 127a . . . 127n and/or the Tx port 200 circuitry.

The processing circuit 202 may also run a cable integrity and quality test between the Tx port 200 and the Rx port to determine signal quality over the wired connection 125a . . . 125n, 127a . . . 127n including, but not limited to, available bandwidth, timing (e.g., propagation delay), receive signal strength, transmit signal strength, etc.

In the case where the Tx port 200 is integrated with the SVR 102 (e.g., Tx ports 154a . . . 154n), the Tx port 200 may also be communicatively coupled with other circuit components of the SVR 102 including, but not limited to, the SVR's processing circuit 156 and memory circuit 154. The Tx port 200 may receive commands and/or transmit data (e.g., signal integrity test results) to and from the processing circuit 156.

Exemplary Rx Port

Figure 3:
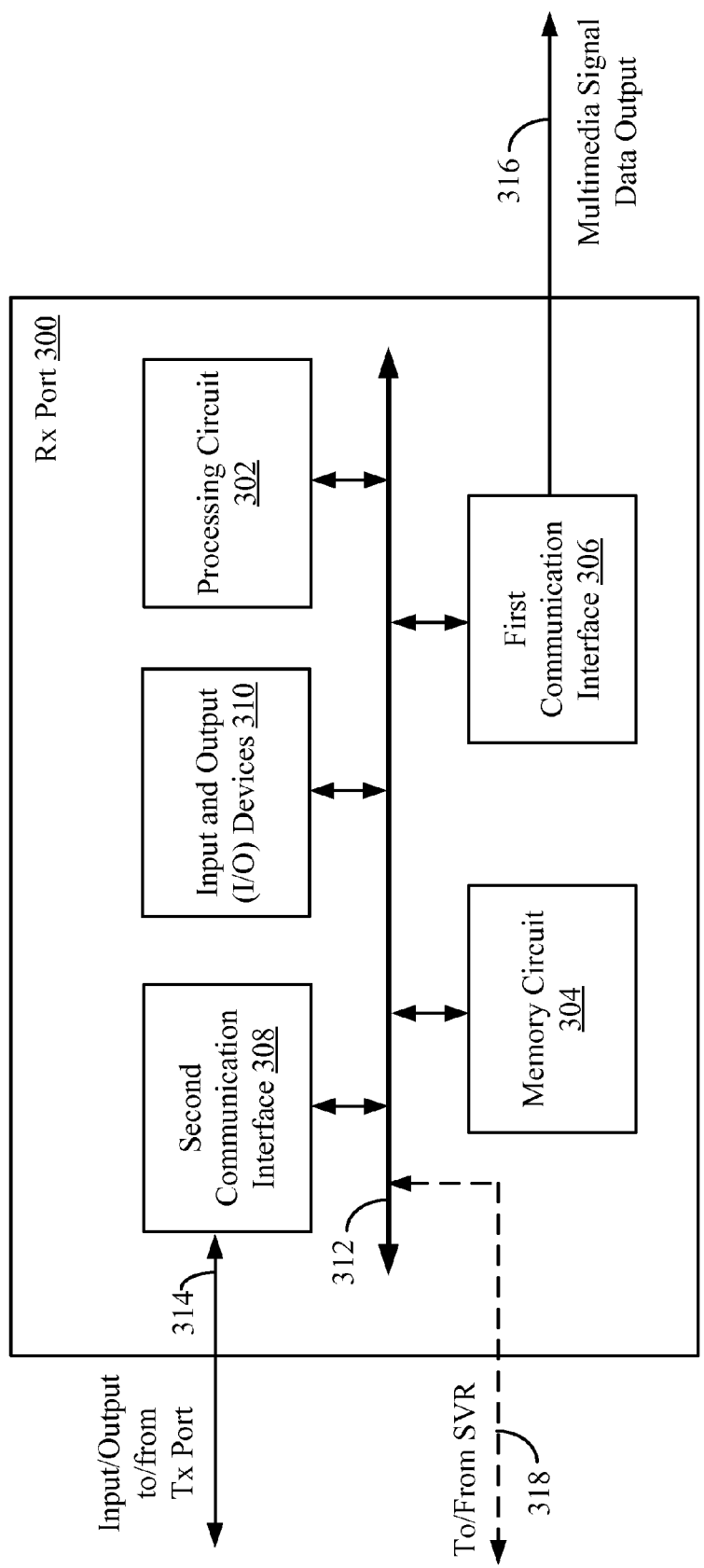
FIG. 3 illustrates a first exemplary schematic block diagram of an Rx port.

FIG. 3 illustrates a schematic block diagram of an Rx port 300 according to one aspect of the disclosure. The Rx port 300 shown in FIG. 3 may represent any one of the stand-alone Rx ports 110a . . . 110n and/or the integrated Rx ports 152a . . . 152n of FIG. 1. Referring to FIG. 3, the Rx port 300 may include at least one processing circuit 302 (e.g., processor(s), ASIC(s), FPGA(s)), at least one memory circuit 304, a first communication interface 306, a second communication interface 308, and/or I/O devices 310. According to one non-limiting, non-exclusive example, the processing circuit 302, the memory circuit 304, the first communication interface 306, the second communication interface 308, and/or the I/O devices 310 may be communicatively coupled together through a communication bus 312. In other examples, the Rx port components 302, 304, 306, 308, 310 may be communicatively coupled through direct and/or indirect signal lines running between them. The Rx port 300 (e.g., the communication bus 312) may also be communicatively coupled (see data path 318) to the SVR 102 in the case where the Rx port 300 is integrated within the SVR 102.

Referring to FIGS. 1, 2, and 3, the second communication interface 308 receives multimedia signal data 314 from a corresponding Tx port (e.g., Tx port 200) over a wired connection (e.g., wired connections 125a . . . 125n, 127a . . . 127n). The second communication interface 308 may be designed to support and receive data according to a first signal type such as, but not limited to, DVI, RS232, HDMI, Display Port, S-video, RCA, $YP_BP_R$, HDBaseT®, high speed SERDES, etc. The second communication interface 308 may also transmit data and commands 314 to the corresponding Tx port 200 over the wired connection 125a . . . 125n, 127a . . . 127n. These commands may initiate signal integrity testing by the Tx port 200 to verify functionality of the Tx port 200 and transmission signal integrity and quality over the wired connections 125a . . . 125a, 127a . . . 127n.

The memory circuit 304 may include volatile (e.g., SRAM, DRAM, SDRAM, etc.) and non-volatile memory (e.g., flash memory, read only memory, MRAM, FRAM, etc.). The memory circuit 304 may store, among other things, one or more known data and video test patterns that are used to verify the data and/or video test patterns received from the Tx port 200 during signal integrity testing. The memory circuit 304 may also simply store instructions that are executed by the processing circuit 302 to generate the known data and video test patterns.

The I/O devices 310 may include one or more buttons that initiate signal integrity testing, reset the Rx port 300, power ON/OFF the Rx port 300, and/or control multimedia signal data conversion. The I/O devices 310 may also include status LED indicators that light up and/or blink to indicate different statuses of the Rx port 300. Non-exhaustive examples of these statuses may indicate whether the Rx port 300 is powered ON/OFF, transmitting an output signal, able to receive an input signal, signal integrity testing passed or failed, various types of errors, etc.

The first communication interface 306 transmits multimedia signal data 316. For example, referring to FIGS. 1 and 3, the first communication interface 306 may transmit such multimedia signal data 316 to a destination device 106a such as a display device in the case where the Rx port 300 is a standalone device (e.g., a dongle) or provide such data to the SVR server 102 (e.g., to the processing circuit 156) in the case where it's integrated within the SVR 102. The first communication interface 306 may be designed to support and transmit data according to various signal types such as, but not limited to, DVI, RS232, HDMI, Display Port, S-video, RCA, $YP_BP_R$, HDBaseT®, high speed SERDES, etc., which may be different than or the same as the first signal type received at the second communication interface 308.

Among other things, the processing circuit 302 transmits data and commands via the second communication interface 308 to initiate signal integrity testing at the Tx port 200. The processing circuit 302 may analyze data and messages received from the Tx port 200 to determine whether cable connection 125a . . . 125n, 127a . . . 127n coupling the Rx port 300 to the Tx port 200 appears functional at a minimum level where at least some data can be passed through and the two ports can communicate in a timely manner. For example, the processing circuit 302 may run a cable integrity and quality test between the Rx port 300 and the Tx port 200 to determine signal quality over the wired connection 125a . . . 125n, 127a . . . 127n including, but not limited to, available bandwidth, timing (e.g., propagation delay), receive signal strength, transmit signal strength, etc.

The processing circuit 302 may also receive data or video test patterns from the Tx port 200 over the wired connections 125a . . . 125n, 127a . . . 127n as part of signal integrity testing. The processing circuit 302 may retrieve a known set of data or video test patterns stored at the memory circuit 304 and compare them to the received video test patterns from the Tx port 200. The Rx port 300 then determines whether the received video test pattern substantially matches its stored, known version. Any substantial variation between the received test pattern and the stored, known test pattern at the Rx port 300 may be attributed to a faulty or degraded wired connection 124a . . . 124n, 126a . . . 126n, Tx port 200 circuitry, and/or Rx port 300 circuitry.

In the case where the Rx port 300 is integrated with the SVR 102 (e.g., Rx ports 152a . . . 152n), the Rx port 300 may also be communicatively coupled with other circuit components of the SVR 102 including, but not limited to, the SVR's processing circuit 156 and memory circuit 154. The Rx port 300 may receive commands and/or transmit data (e.g., signal integrity test results) to and from the processing circuit 156.

Exemplary Tx Port and Rx Port Communicatively Coupled Together

Figure 4:
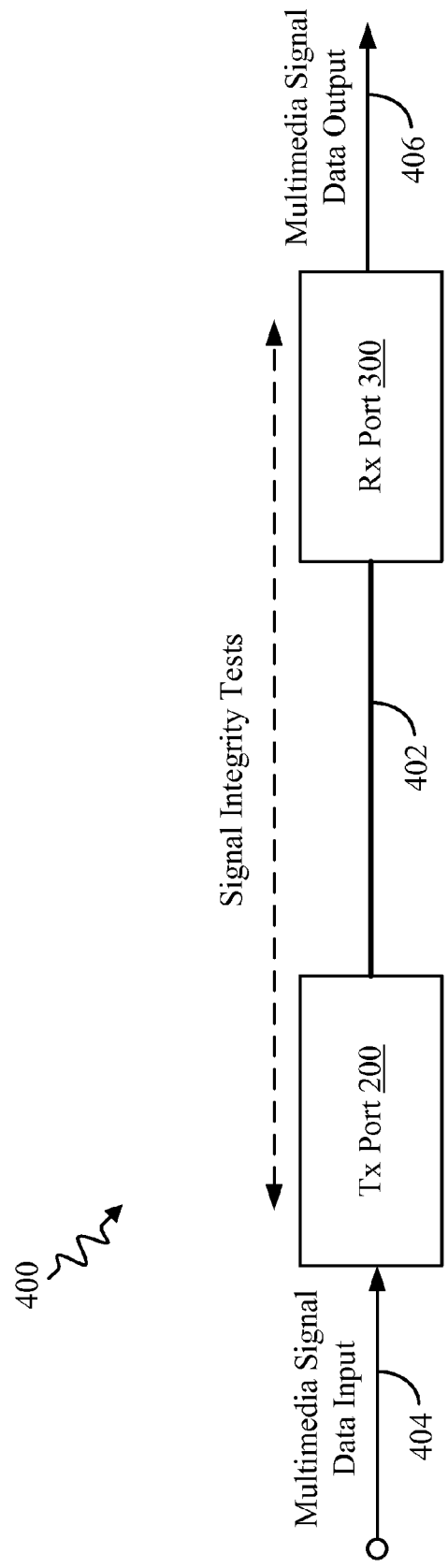
FIG. 4 illustrates a high-level schematic block diagram of a second exemplary multimedia network communication system.

FIG. 4 illustrates a high-level schematic block diagram of a multimedia network communication system 400 according to one aspect of the disclosure. The system 400 includes the Tx port 200 and the Rx port 300 coupled to one another through a wired connection 402. The wired connection 402 includes an electrical conductor-based wired connection and/or a fiber optic-based wired connection that transmits data using light. Some non-limiting, non-exclusive examples of electrical conductor-based wired connections include coaxial cables, twisted pair cabling such as, but not limited to, cat5, cat5e, and cat6 cables. The wired connection 402 may be any one of the wired connections 125a . . . 125n, 127a . . . 127n shown in FIG. 1. In another aspect, the connection between the Tx port 200 and the Rx port 300 may be wireless.

The Tx port 200 receives incoming multimedia signal data 404 as an input, and the Rx port 300 transmits outgoing multimedia signal data 406 as an output. The incoming multimedia signal data 404 may come from a multimedia signal source such as the sources 104a . . . 104n (e.g., directly or indirectly through the data converters 105a . . . 105n) shown and described above with respect to FIG. 1. The outgoing multimedia signal data 406 may go to a multimedia destination such as the destination devices 106a . . . 106n shown and described above with respect to FIG. 1. The output multimedia signal data 406 may include the incoming multimedia signal data 404 except that it may be a different multimedia signal type. In some cases both the incoming and outgoing multimedia signal data 404, 406 may be of the same signal type, in which case, the two may be identical or substantially identical signals.

Types of Signal Integrity Tests

The wired connection 402 may be susceptible to damage or disconnection from the Tx port 200 and/or the Rx port 300. Alternatively, the Tx port 200 and the Rx port 300 may themselves fail to operate correctly. In either case, a loss of outgoing multimedia signal data 406 may occur, which may be problematic.

Figure 5:
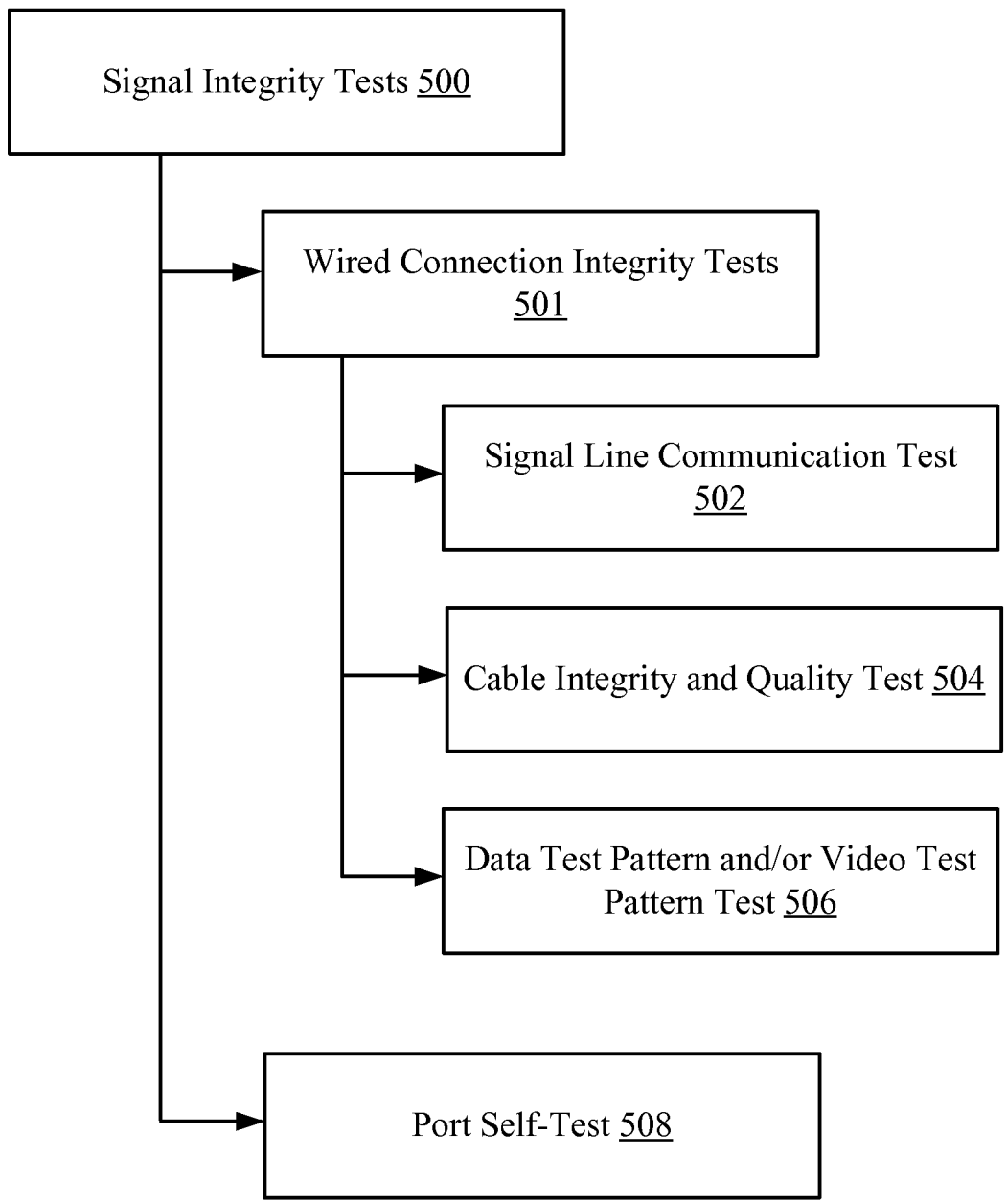
FIG. 5 illustrates various types of signal integrity tests.

FIG. 5 illustrates various types of signal integrity tests 500 according to one aspect. Referring to FIGS. 4 and 5, the Tx port 200 and Rx port 300 may execute and conduct these signal integrity tests 500 to determine whether there are any faults at the Tx port 200, the wired connection 402, and/or the Rx port 300. The signal integrity tests 500 may include wired connection integrity tests 501 and port self-tests 508. The wired connection integrity tests 501 may include signal line communication tests 502, cable integrity and quality tests 504, and data test pattern and/or video test pattern tests 506.

The signal line communication tests 502 determine whether the Tx port 200 and the Rx port 300 (e.g., their respective processing circuits 202, 302) can communicate with one another even if at a minimum level of functionality. For example, the signal line communication test 502 may determine whether data may be transmitted between the Tx port 200 and Rx port 300 in order to conduct the other tests and transmit multimedia signals. As just one example, the signal line communication test 502 may fail if the wired connection 402 is disconnected from either the Tx port 200 or the Rx port 300.

The cable integrity and quality tests 504 may determine signal strength properties of the communication channel between the Tx port 200 and the Rx port 300. These tests 504 may determine, for example, the transmit power of a signal at the Tx port 200 and the corresponding receive power of the signal at the Rx port 300, and vice versa. This allows the signal loss through the wired connection 402 to be determined. These transmit power, receive power, and cable power loss values may be tracked over time (e.g., saved in a memory circuit at either the Tx port 200 and/or the Rx port 300) to determine whether there is a degradation in the signal quality through the wired connection 402. Some of these values can even be stored at the time of initial installation and system commissioning so as to compare later values to the initial installation values. The cable integrity and quality tests 504 may also determine the available bandwidth of the wired connection 402, the maximum data rates achievable for the given length of the wired connection 402, and/or propagation delay between the Tx and Rx ports 200, 300.

The data test pattern and the video test pattern tests 506 determine whether the Rx port 300 is able to accurately receive data signals and video signals of a sufficient quality from the Tx port 200. In some cases the wired connection 402 may have faults associated with it that substantially degrade the transmission of data and/or video signals but still allow for basic communication signals to be transmitted and received between the Tx port 200 and Rx port 300. Thus, the data and video test pattern tests 506 go further than the signal line communication tests 502 to determine that data signals and video signals can indeed be accurately and properly transmitted from the Tx port 200 to the Rx port 300. The data and video test pattern tests 506 include test patterns that are known to both the Tx port 200 and the Rx port 300. That is, the known test patterns—or the instructions/algorithms used to generate the test patterns—may be stored at the memory circuits 204, 304 of the Tx and Rx ports 200, 300. Thus, the Tx port 200 may transmit a test pattern known to the Rx port 300.

Upon receiving the test pattern over the wired connection 402, the Rx port 300 may analyze it and compare it to its own test pattern that is stored in its own memory circuit 304 or generated by its processing circuit 302 using instructions stored in its memory circuit 304. The Rx port 300 may then determine whether the two test patterns (the one received and its own test pattern) match to a sufficient degree. If the received test pattern is substantially different from its own test pattern and/or does not sufficiently match its own test pattern to a degree that exceeds a pre-defined threshold value, the test pattern test 506 may be considered to have failed. This process applied to both data test patterns and also video test patterns.

The port self-tests 508 may be conducted at Tx port 200 and the Rx port 300 to determine that each port 200, 300 is correctly operating. Thus, the Tx port 200 may initiate a self-test 508 to determine that each of its active components 202, 204, 206, 208, 210, 212 are operational. This may include measuring the internal temperature of the Tx port 200 and/or its components 202, 204, 206, 208, 210, 212 and determining whether they are within an acceptable range. This may also include checking the internal power supply voltages of the Tx port 200 and determining whether they too are within an acceptable range. Similarly, the Rx port 300 may initiate a self-test 508 to determine that each of its active components 302, 304, 306, 308, 310, 312 are operational. This may include measuring the internal temperature of the Rx port 300 and/or its components 302, 304, 306, 308, 310, 312 and determining whether they are within an acceptable range. This may also include checking the internal power supply voltages of the Rx port 300 and determining whether they too are within an acceptable range.

Test Initiation

The signal integrity tests 500 may be initiated at both the Tx port 200 and the Rx port 300 in a variety of ways. Referring to FIGS. 1, 2, 3, and 4, if the Tx port 200 and the Rx port 300 are standalone devices (e.g., Tx ports 108a . . . 108n and Rx ports 110a . . . 110n), then according to one example, the signal integrity tests 500 may initiated manually at the ports 200, 300 themselves. For example, the Tx port 200 and Rx port 300 may each feature one or more buttons (e.g., I/O devices 210, 310) that if activated (e.g., pushed) cause the port 200, 300 to initiate one or more signal integrity tests 500. According to one aspect, each port 200, 300 may have different button selections to initiate different tests including the signal line communication tests 502, the cable integrity and quality tests 504, data and/or video test pattern tests 506, and/or the port self-tests 508. In one case, the data converters 105a . . . 105n may transmit a command to the Tx ports 108a . . . 108n that causes the Tx ports 108a . . . 108n to initiate one or more signal integrity tests 500.

According to another example, signal integrity tests 500 may be initiated automatically by the Tx port 200 and the Rx port 300. For instance, any one or more of the aforementioned signal integrity tests 500 may be scheduled to take place at the Tx port 200 and/or Rx port 300 in advance, or be conducted during a time of inactivity associated with the location of where the system resides (e.g., during off hours where the location is not busy). The processing circuits 202, 302 of the Tx and Rx ports 200, 300 may initiate such scheduled tests. According to yet another example, in the case where the Tx port 200 and the Rx port 300 are integrated with the SVR 102 (e.g., integrated Tx ports 154a . . . 154n and integrated Rx ports 152a . . . 152n), the Tx and Rx ports 200, 300 and their processing circuits 202, 302 may receive commands/instructions from the SVR's processing circuit 156 to initiate one or more signal integrity tests 500. According to one aspect, motion detectors near the system 100 may determine that there is no activity in the location (e.g., operating room) where the system 100 resides and instruct the SVR 102, which in turn instructs the Tx and Rx ports 200, 300 to initiate signal integrity testing.

Commands/instructions to initiate signal integrity tests 500 may also be received remotely. For example, the remote server 112 may transmit a request to the SVR 102, the Tx ports 108a . . . 108n, 154a . . . 154n, and/or the Rx ports 152a . . . 152n, 110a . . . 110n to initiate one or more signal integrity tests 500. Commands/instructions for such test initiation sent to the SVR 102 may in turn be forwarded to the Tx ports 108a . . . 108n, 154a . . . 154n, and/or the Rx ports 152a . . . 152n, 110a . . . 110n. The remote server 112, which may be associated with a support team/desk in charge of maintaining the system 100, may transmit such requests for signal integrity testing 500 periodically to confirm the operational status of the system 100 and its components 102, 108a . . . 108n, 110a . . . 110n, 124a . . . 124n, 126a . . . 126n.

Signal line communication tests 502 may be performed frequently throughout a day. More elaborate tests, such as the cable integrity and quality tests 504 and the data or video test pattern tests 506, may be performed automatically during system "off hours" or while the system is not in use. In the latter case the Tx ports 200 and Rx ports 300 may utilize of motion sensing or Health Level Seven International (HL7) communications to determine room activity of where the system 100 where such tests would like to be performed resides. The HL7 messaging occurs within hospital networks and among other things may inform the SVR 102 whether there are operations/cases/matters scheduled for the room within which the system 100 may reside in the case where the system resides in a medical setting. This information coupled with motion sensors and off peak hours allows the SVR 102, Tx port 200, and/or the Rx port 300 initiate signal integrity tests 500.

The Signal Line Communication Test

Figure 6:
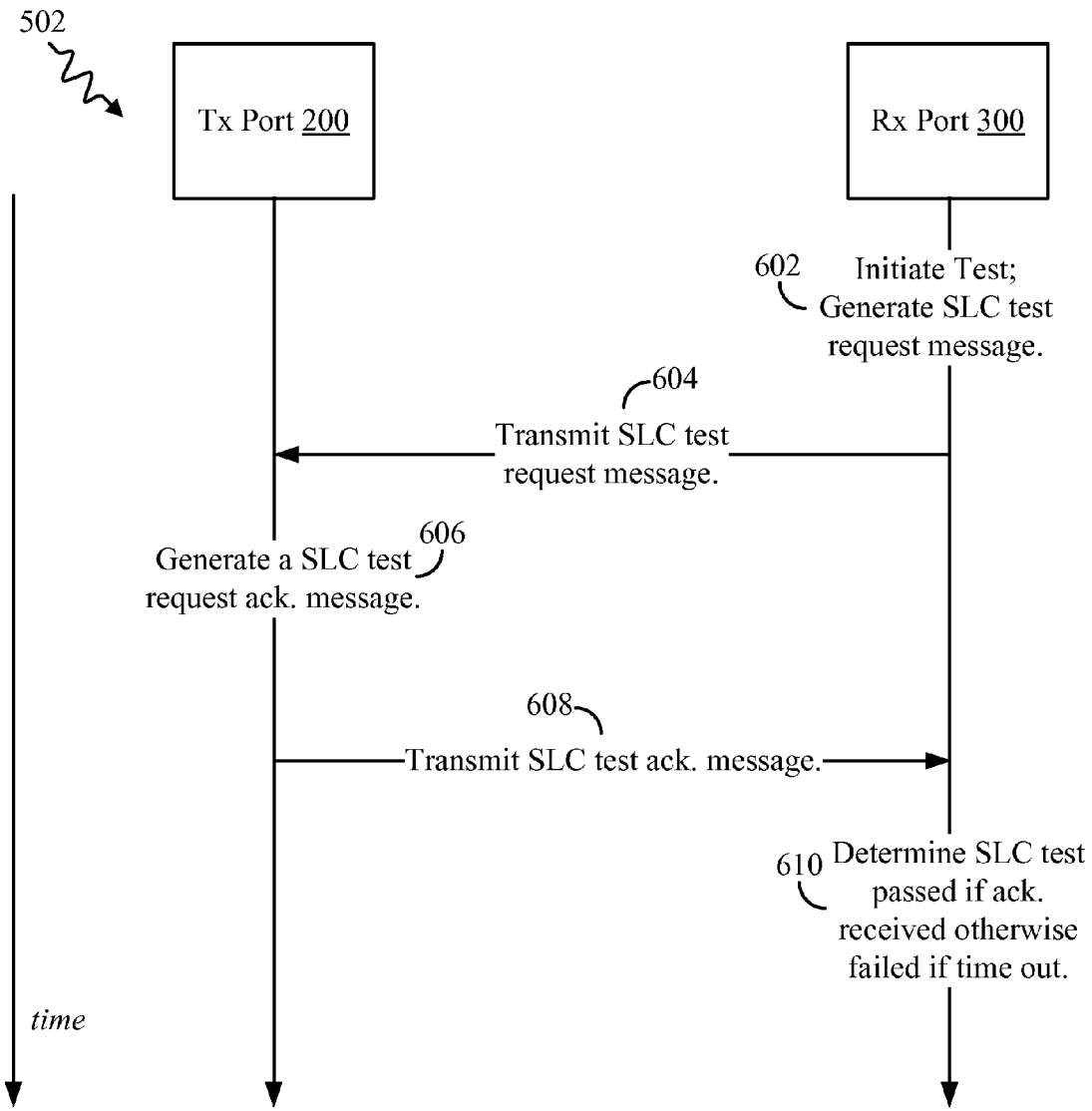
FIG. 6 illustrates a process flow diagram of a signal line communication test taking place at and between a Tx port and an Rx port.

FIG. 6 illustrates a process flow diagram of the signal line communication (SLC) test 502 taking place at and between the Tx port 200 and the Rx port 300 according to one aspect. Referring to FIGS. 1, 2, 3, 4, and 6, the SLC test 502 may start with the Rx port 300 initiating the SLC test 502 and generating 602 a SLC test request message. The Rx port 300 may then transmit 604 the SLC test request message to the Tx port 200. Assuming the wired connection 402 is functional and connected properly, the Tx port 200 receives the SLC test request message and generates 606 a SLC test acknowledgement message in response. The Tx port 200 then transmits 608 the SLC test acknowledgement message to the Rx port 300. Assuming the wired connection 402 is functional and connected properly, the Rx port 300 receives the SLC test acknowledgement message and determines 610 that the SLC test 502 passed. Otherwise if it doesn't receive the SLC test acknowledgement message within a certain period of time or receives a corrupted acknowledgement message, the Rx port 300 may determine that the SLC test 502 failed.

In the example shown in FIG. 6, the Rx port 300 initiates the SLC test 502 and determines whether the test 502 pass or failed. However, the same steps described above may be performed in reverse with the Tx port 200 initiating the SLC test 502 (e.g., generating and transmitting the SLC test request message) and determining whether the test 502 passed or failed based on the response or lack thereof by the Rx port 300.

The SLC test 502 may be performed by both the Tx port 200 and the Rx port 300 very frequently (e.g., once a second) since the ports 200, 300 are almost always communicating bi-directionally. In the event there is a loss of communication (e.g., disconnected wired connection 402), each port will indicate a communication fault condition. For example, if the Tx port 200 is integrated in SVR 102 (e.g., Tx ports 154a ... 154n) and does not receive acknowledgements 608 from the standalone RX port 300 (e.g., Rx ports 110a ... 110n), then a fault is immediately reported to SVR 102 by the Tx port 200 and the RX port 300 may illuminate a status LEDs (e.g., I/O device 310) indicating the faulty communication. Similarly, if the Tx port 200 is a standalone Tx port (e.g., Tx ports 108a ... 108n) and it does not receive acknowledgements 608 from the integrated RX port 300 (e.g., Rx ports 152a ... 152n), then a fault is immediately reported to SVR 102 by the Rx port 300 and the TX port 200 may illuminate a status LEDs (e.g., I/O device 210) indicating the faulty communication.

The Cable Integrity and Quality Tests

Figure 7:
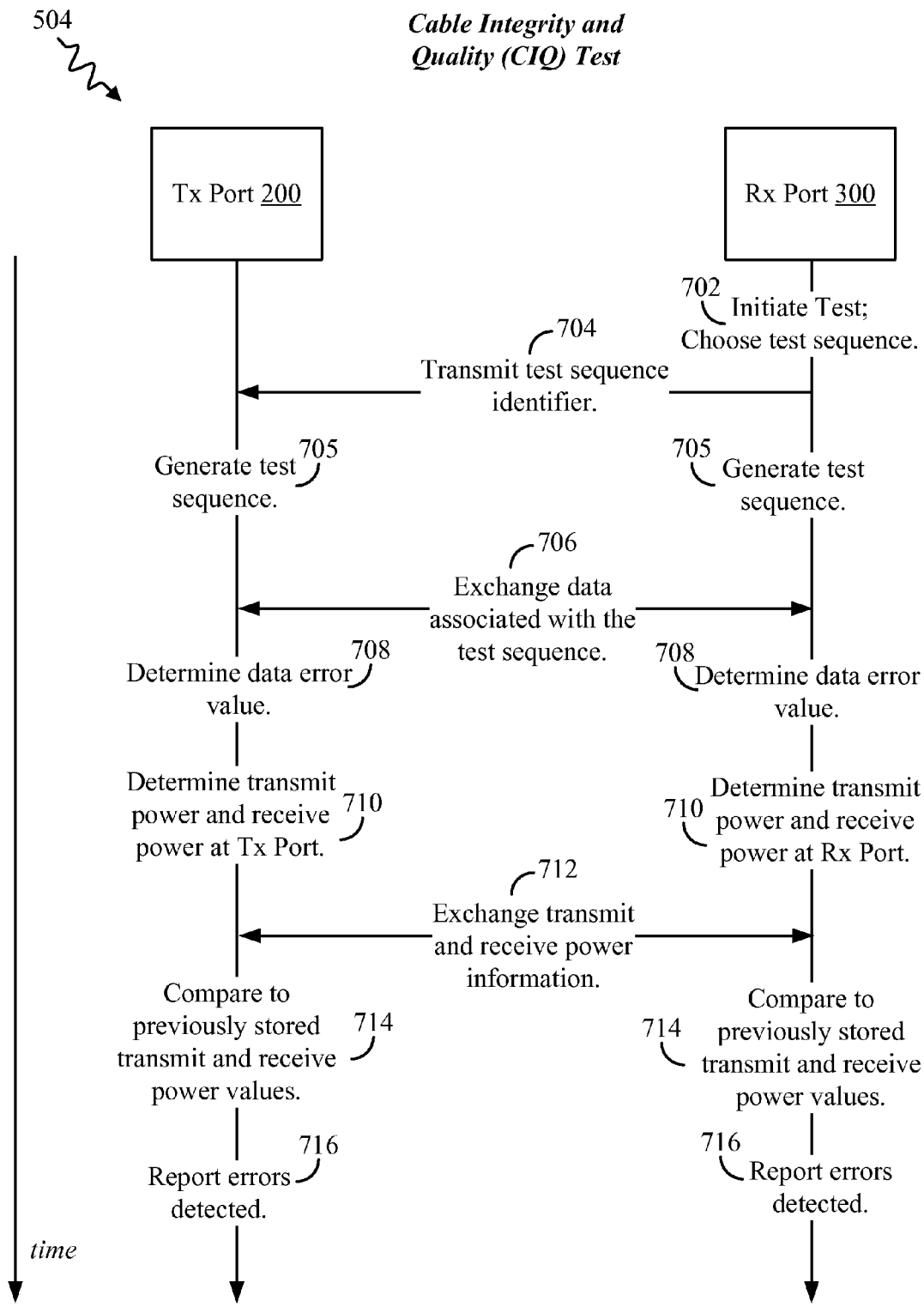
FIG. 7 illustrates a first exemplary process flow diagram of a cable integrity and quality test taking place at and between a Tx port and an Rx port.

FIG. 7 illustrates a first exemplary process flow diagram of the cable integrity and quality (CIQ) test 504 taking place at and between the Tx port 200 and the Rx port 300 according to one aspect. Referring to FIGS. 1, 2, 3, 4, and 7, the CIQ test 504 may start with the Rx port 300 initiating 702 the CIQ test 504 and choosing which specific test sequence out of a plurality of test sequences should be executed by the Tx port 200 and Rx port 300. A test sequence identifier that identifies the test sequence chosen is then transmitted 704 to the Tx port 200.

The Tx port 200 and the Rx port 300 each generate the test sequence chosen independently and then exchange 706 data associated with the test sequence. For example, the Tx port 200 may transmit a Tx port-generated test sequence it generated to the Rx port 300, and the Rx port 300 may transmit an Rx port-generated test sequence it generated over to the Tx Port 200. Thus, the Rx port 300 receives the Tx port-generated test sequence and the Tx port 200 receives the Rx port-generated test sequence. Both the Tx port-generated test sequence and the Rx port-generated test sequence may be the same.

The test sequence may be a pseudo-random bit sequence (PRBS). As some non-limiting, non-exclusive examples, the PRBS used may be based on $2^7-1$, $2^{23}-1$, $2^{31}-1$, etc. number of elements. The test sequences may also include continuous random test patterns (CRPAT), high-frequency patterns, low-frequency patterns, mixed-frequency patterns, long/short patterns, etc. The Tx port 200 and/or the Rx port 300 may then determine 708 a data error value associated with the test sequence received from the other. For example, the Tx Port 200 may compare the test sequence received from the Rx port 300 to the same test pattern obtained on its own (e.g., retrieved from its memory circuit 204 or generated by its processing circuit 202 using instructions for the test pattern stored in its memory circuit 204) to determine how many of the received bits/characters are incorrect. The data error value generated is based on the number of bits/characters that are incorrect. Similarly, the Rx Port 300 may compare the test sequence received from the Tx port 200 to the same test pattern obtained on its own (e.g., retrieved from its memory circuit 304 or generated by its processing circuit 302 using instructions for the test pattern stored in its memory circuit 304) to determine how many of the received bits/characters are incorrect.

The Tx port 200 and Rx port 300 may also determine 710 their own transmit power of the test sequence they transmitted to the other and also determine 710 the receive power of the test sequence they received from the other. For example, the Tx port 200 may calculate the transmit power of the test sequence it transmitted to the Rx port 300 (herein referred to as "$TxPower_{200}$"). It may then determine the power of the test sequence received from the Rx port 300 at the Tx port 200 (herein referred to as "$RxPower_{200}$"). Similarly, the Rx port 300 may calculate the transmit power of the test sequence it transmitted to the Tx port 200 (herein referred to as "$TxPower_{300}$"). It may then determine the power of the test sequence received from the Tx port 200 at the Rx port 300 (herein referred to as "$RxPower_{300}$"). The Tx port 200 and Rx port 300 may then exchange 712 this information (i.e., $TxPower_{200}$, $RxPower_{200}$, $TxPower_{300}$, $RxPower_{300}$) with each other.

Once the Tx port 200 and the Rx port 300 obtain the aforementioned transmit and receive power information of the two ports 200, 300, they can each make many calculations. For example, the Tx port 200 and Rx port 300 may each determine what the signal loss is through the wired connection 402. This may be done by comparing $TxPower_{200}$ to $RxPower_{300}$ to determine the loss in power through the wired connection 402 for the transmission of the test sequence from the Tx port 200 to the Rx port 300. Similarly, $TxPower_{300}$ may be compared to $RxPower_{200}$ to determine the loss in power through the wired connection 402 for the transmission of the test sequence from the Rx port 300 to the Tx port 200.

Notably, the $TxPower_{200}$, $RxPower_{200}$, $TxPower_{300}$, $RxPower_{300}$, and the signal loss power through the wired connection 402 values (collectively known as "power metric values") may be stored at the memory circuits 204, 304 of the Tx port 200 and Rx port 300. Moreover, the determined power metric values may be compared 714 to previously stored power metric values, such as those values initially obtained during initial installation and setup, to determine whether there has been a change and/or degradation in any of the power metric values, which may be indicative of degraded wired connection 402.

Depending on the comparisons made one or more errors may be reported by the Tx port 200 and/or the Rx port 300. For example, if any of the power metric values falls short of meeting and/or exceeding a threshold value, the failure may be reported to the SVR 102, the remote server 112, and/or status LEDs may illuminate at the Tx port 200 and/or Rx port 300. As another example, if any of the power metric values deviates from an originally stored value (e.g., drops by a certain threshold percentage value) then that too may be reported to the SVR 102 (e.g., processing circuit 156), the remote server 112, and/or status LEDs may illuminate at the Tx port 200 and/or Rx port 300. As yet another example, if the data error values at either the Tx port 200 and/or the Rx port 300 value exceed a certain threshold value then these data error value(s) may be reported in a similar manner as well. Once reported to the SVR 102 and/or the remote server 112 or if status LEDs illuminate indicating fault, personnel may be alerted to correct the problem and/or conduct additional testing to determine the specific source of the problem.

In the example shown in FIG. 7, the Rx port 300 initiates the test and chooses the test sequence. In other examples the Tx port 200 may initiate the test and choose the test sequence. Moreover, the process shown in FIG. 7 may be repeated by the Tx port 200 and/or the Rx port 300 using different test sequences each time.

Figure 8:
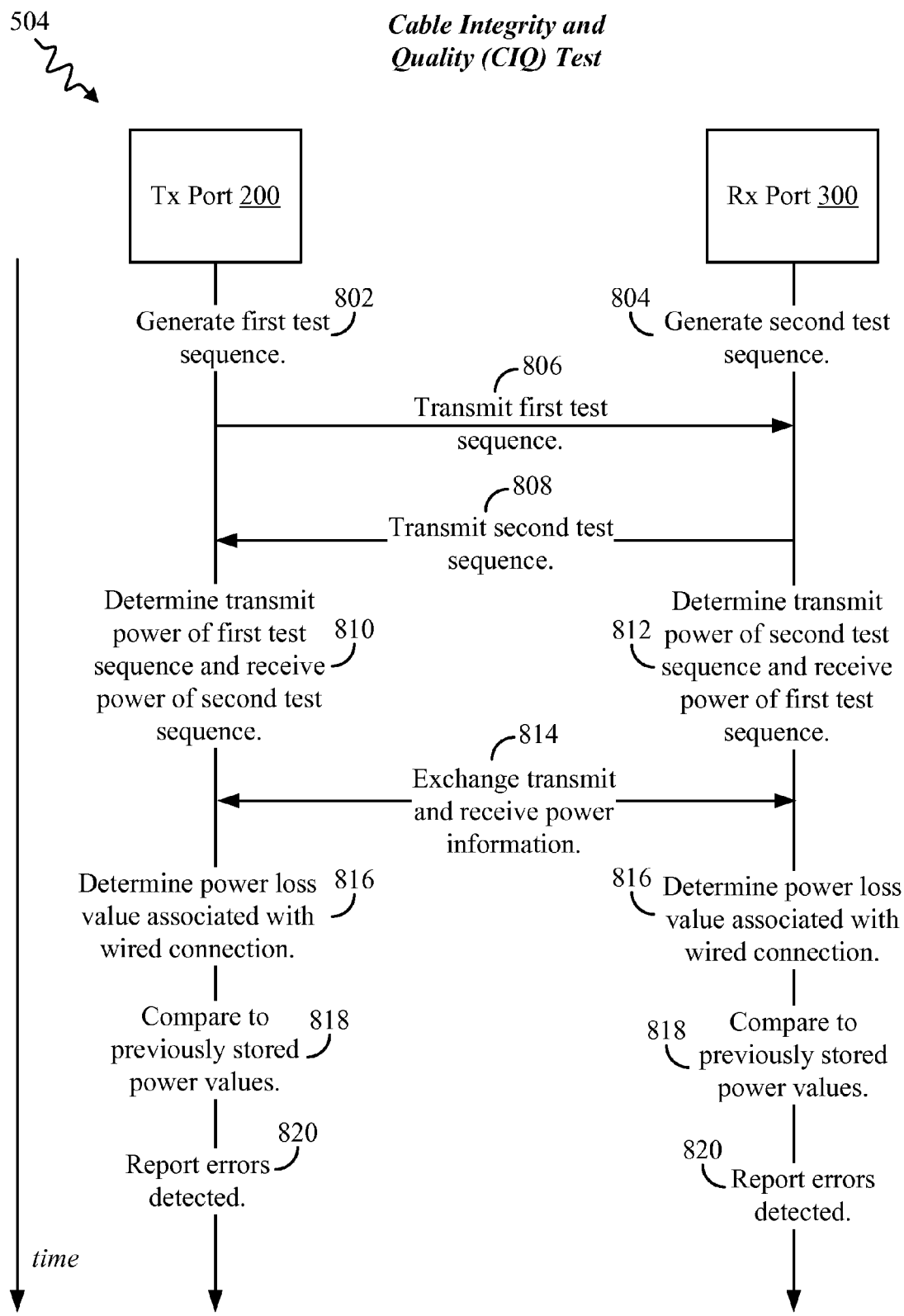
FIG. 8 illustrates a second exemplary process flow diagram of a cable integrity and quality test taking place at and between a Tx port and an Rx port.

FIG. 8 illustrates a second exemplary process flow diagram of the CIQ test 504 taking place at and between the Tx port 200 and the Rx port 300 according to one aspect. Referring to FIGS. 1, 2, 3, 4, and 8, the CIQ test 504 may commence by the Tx port 200 generating 802 a first test sequence and the Rx port 300 generating 804 a second test sequence. The first and second test sequences may be the same or may be different. Next, the Tx port 200 transmits 806 the first test sequence to the Rx port 300, and the Rx port 300 transmits 808 the second test sequence to the Tx port 200. The Tx port 200 may then determine 810 the transmit power of the first sequence it transmitted to the Rx port 300 and also the receive power of the second sequence it received from the Rx port 300. Similarly, the Rx port 300 may then determine 812 the transmit power of the second sequence it transmitted to the Tx port 200 and also the receive power of the first sequence it received from the Tx port 200.

The Tx port 200 and the Rx port 300 may then exchange 814 the transmit and receive power determinations they made with each other. This allows them to each determine 816 a power loss value associated with the wired connection 402 (e.g., power loss through the wired connection 402). This may be done by comparing the transmit and receive powers of the first sequence with each other to determine the signal loss (e.g., power loss value) for the transmission of the test sequence from the Tx port 200 to the Rx port 300. Similarly, the transmit and receive powers of the second sequence may be compared with each other to determine the signal loss (e.g., power loss value) for the transmission of the test sequence from the Rx port 300 to the Tx port 200.

As described above with respect to FIG. 7, the power level values (e.g., transmit power at Tx port 200, transmit power at Rx port 300, receive power at Tx port 200, receive power at Rx port 300, power loss values associated with the wired connection) may all be stored and compared with previously stored values. Any degradation in such values may be reported.

The Data Test Pattern and Video Test Pattern Tests

Figure 9:
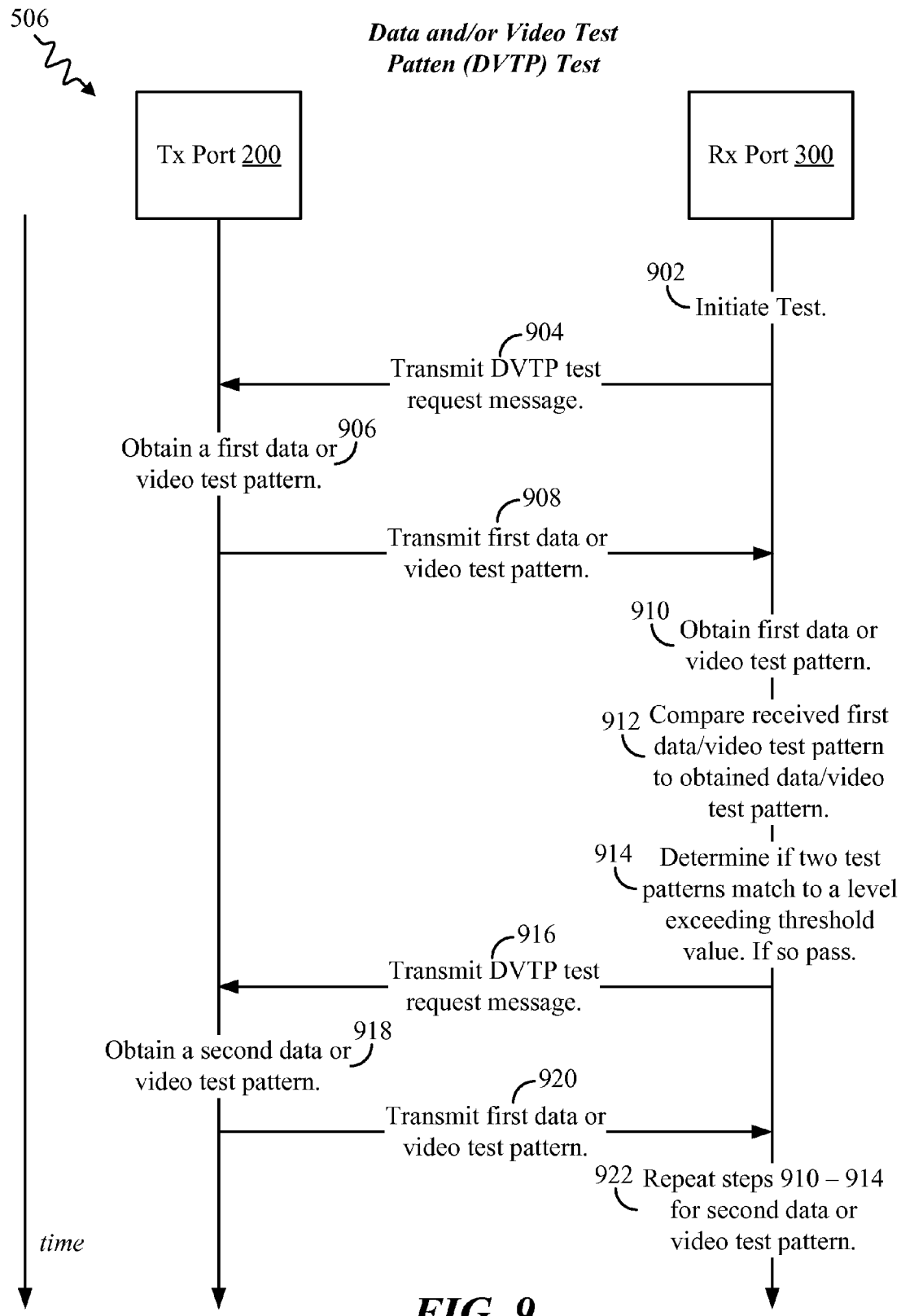
FIG. 9 illustrates a process flow diagram of a data and/or video test pattern test taking place at and between a Tx port and an Rx port.

FIG. 9 illustrates a process flow diagram of the data and/or video test pattern (DVTP) test 506 taking place at and between the Tx port 200 and the Rx port 300 according to one aspect. Referring to FIGS. 1, 2, 3, 4, and 9, the DVTP test 506 may start with the Rx port 300 initiating 902 the DVTP test 506. The Rx port 300 may transmit 904 a DVTP test request message to the Tx port 200 that indicates the specific data or video test pattern requested. The Tx port 200 receives the DVTP test request message and obtains 906 a first data or video test pattern. The Tx port 200 may obtain the first data or video test pattern directly from its memory circuit 204 or alternatively it may generate it at its processing circuit 202 by executing instructions/algorithms stored at its memory circuit 204.

The Tx port 200 then transmits 908 the first data or video test pattern (e.g., "Tx-generated data or video test pattern") to the Rx port 300 over the wired connection 402. Assuming the wired connection 402 is operational and properly connected, the Rx port 300 receives the first data or video test pattern from the Tx port 200. The Rx port 300 then obtains 910 the corresponding first data or video test pattern from its memory circuit 304 or generates it using its processing circuit 302 based on instructions/algorithm stored in its memory circuit 304 (herein may be referred to "Rx port-generated data or video test pattern"). The Rx port 300 then compares 912 the received first data or video test pattern to the first Rx port-generated data or video test pattern. The Rx port 300 then determines 914 how closely the received first data or video test pattern matches the first Rx port-generated data or video test pattern. If the two match to a level that exceeds a threshold value then the DVTP test 506 may be considered passed. Otherwise if it's below the threshold value the test 506 may be considered to have failed.

In the case where the test pattern used was a video test pattern, the Rx port 300 (e.g., processing circuit 302) may perform a pixel-to-pixel analysis of the received video test pattern to the Rx port-generated video test pattern when determining how closely the two match. In the case where the test pattern used was a data test pattern, the Rx port 300 (e.g., processing circuit 302) may perform a bit-to-bit analysis of the received data test pattern to the Rx port-generated data test pattern when determining how closely the two match. One example of a threshold value is that at least a certain percentage (e.g., 80%, 85%, 90%, 95%, 99%, etc.) of the pixels or bits must match between the received data or video test pattern and the Rx port-generated data or video test pattern before the DVTP test 506 may be considered passed.

The Rx port 300 may then transmit 916 another DVTP test request message to the Tx port 200. The Rx port 300 may choose to do this if the first data or video test pattern received did not match the first stored data or video test pattern and the DVTP test 506 failed. However, according to some cases, the Rx port 300 may choose to transmit 916 the second VTP test request regardless of whether the first VTP test passed or failed. The Tx port 200 then receives the DVTP test request message and obtains 918 a second data or video test pattern. The Tx port 200 may obtain the second data or video test pattern directly from its memory circuit 204 or alternatively it may generate it at its processing circuit 202 by executing instructions/algorithms stored at its memory circuit 204. The Tx port 200 then transmits 920 the second data or video test pattern to the Rx port 300 over the wired connection 402. Assuming the wired connection 402 is operational and properly connected, the Rx port 300 receives the second data or video test pattern from the Tx port 200. The Rx port 300 then repeats 922 the steps 910, 912, 914 described above with respect obtaining the second stored data or video test pattern, comparing it to the received second data or video test pattern, and determining whether the two match to a sufficient degree to declare the DVTP test 506 as having passed or failed. Additional data or video test patterns may requested from the Tx port 200 to verify video signal quality over the wired connection 402.

In the example shown in FIG. 9, the Rx port 300 initiates the DVTP test 506 and determines whether the test 506 pass or failed. However, in another aspect, the Tx port 200 may initiate the DVTP test 506 by sending a notification that it will soon transmit 908 the first data or video test pattern. The rest of the steps 910-922 in this case may be the same. In another aspect, the steps described above with respect to FIG. 9 may be performed in reverse with the Tx port 200 initiating the DVTP test 506 (e.g., generating and transmitting the VTP test request message), the Rx port 300 transmitting the first data or video test pattern, and the Tx port 200 determining whether the DVTP test 506 passed or failed based on a comparison of the received data or video test pattern and a corresponding stored data or video test pattern.

Figure 10:
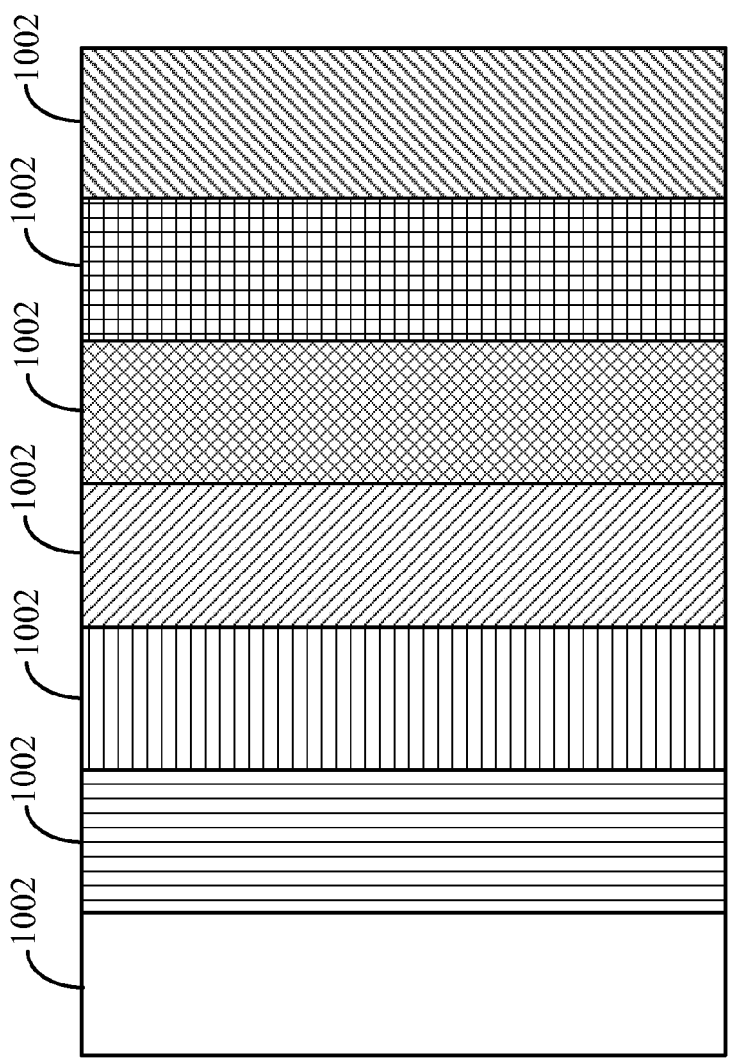
FIG. 10 illustrates an exemplary video test pattern.

FIG. 10 illustrates an exemplary video test pattern 1000 according to one aspect of the disclosure. The video test pattern 1000 may consist of different colored bands 1002 to help determine whether a specific color (e.g., white, black, red, blue, yellow, green, etc.) is not displaying properly. The video test pattern 1000 is specific in that the colored bands 1002 appear at certain pixel locations and in a particular order that is known to the Tx port 200 and the Rx port 300 in order for the Rx port 300 to determine whether the video test pattern it received is correct.

Referring to FIGS. 1, 2, 3, 4, and 10, the video test pattern 1000 may be routed from the Rx port 300 to a destination device 106*a* . . . 106*n* such as a display device so that the video test pattern 1000 may be visually inspected by a user. Inconsistencies or errors in the video test pattern shown on the display device will help a user determine if there is a video signal transmission error occurring somewhere along the communication path between the source 104*a* . . . 104*n* and the destination device 106*a* . . . 106*n*. The video test pattern 1000 shown in FIG. 10 is merely an example. Any combination of colors and patterns may be used in generating a video test pattern.

Based on one aspect of the disclosure, video test pattern data transmitted by the Tx port 200 to the Rx port 300 may be forwarded by the Rx port 300 to the SVR's processing circuit 156 for analysis at the SVR 102. That is, the SVR's processing circuit 156 retrieves the corresponding ideal video test pattern from its memory circuit 154 and compares it to the received video test pattern to determine whether the two match to a level that exceeds a threshold value.

Signal Integrity Test Interpretation and Reporting

Referring to FIGS. 1, 2, 3, 4, and 5, signal integrity test 500 results (i.e., pass or fail) may be visually reported to a user through the use of status LEDs 210, 310 displayed at the Tx port 200 and/or the Rx port 300. That is, a plurality of LEDs 210, 310 at the Tx port and/or the Rx port 300 may signal the results of the one or more signal integrity tests 500. A user visually inspecting the status LEDs 210, 310 may then determine whether Tx port 200, Rx port 300, and/or the wired connection 402 has a fault/error.

According to another example, signal integrity test 500 results may be transmitted from the Tx port 200 or the Rx port 300 to the processing circuit 156 of the SVR 102. A user accessing the SVR 102 may then read the results of the signal integrity tests 500 and determine what wired connections 124*a* . . . 124*n*, 126*a* . . . 126*n* in the system 100 and/or which ports 108*a* . . . 108*n*, 110*a* . . . 110*n*, 152*a* . . . 152*n*, 154*a* . . . 154*n* in the system 100 may have faults/errors.

Any and all signal integrity test 500 results may also be transmitted/reported to the remote server 112 to inform a support team of any faults/errors. For example, the SVR 102 may report test 500 results to the remote server 112 through the network 114. Additionally, the results of any signal integrity tests 500 automatically performed according to a schedule may be reported to the SVR 102 and/or the remote server 112.

Referring to FIGS. 2, 3, and 4, the SLC test may result in an communication failure where the Tx port 200 and Rx port 300 cannot establish communication with each other. In such a case a status LED at the Tx port 200 and/or the Rx port 300 may light up indicating the communication failure.

As described above, if during a CIQ test it is determined that the signal quality of a wired connection (e.g., wired connection 124*a* . . . 124*n*, 126*a* . . . 126*n*, 402) has degraded in quality as compared to a previously stored CIQ test result, then status LEDs corresponding to the signal quality degradation error may light up at the Tx port 200 and/or the Rx port 300, and/or a message including the error may be sent to the SVR's processing circuit 156 and the remote server 112.

Exemplary Tx Port

Figure 11:
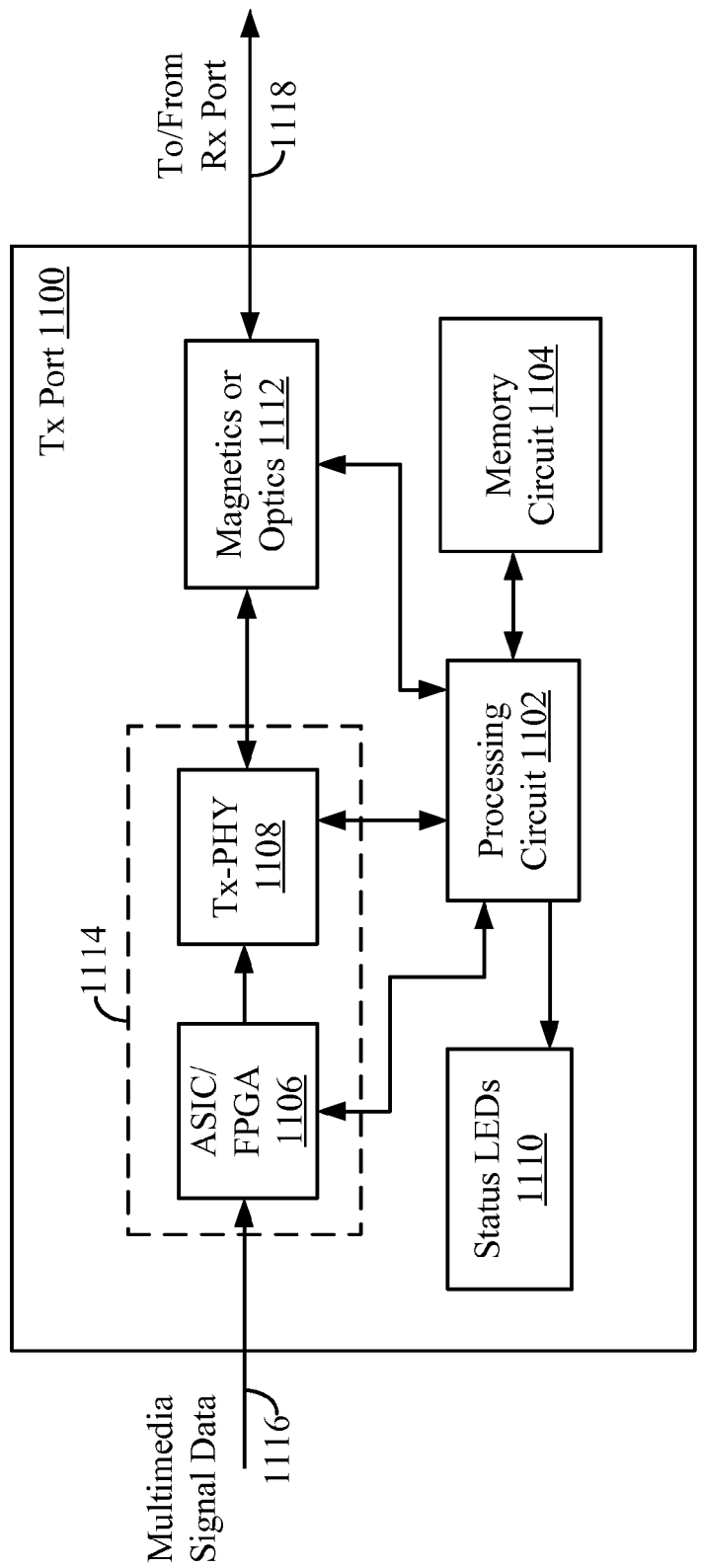
FIG. 11 illustrates a second exemplary schematic block diagram of a Tx port.

FIG. 11 illustrates a block diagram of the Tx port 1100 according to one aspect of the disclosure. The Tx port 1100 may include a processing circuit 1102, a memory circuit 1104, an application specific integrated circuit (ASIC) or a field-programmable gate array (FPGA) 1106, a Tx physical layer circuit (PHY) 1108, status LEDs 1110, and/or a magnetics/optics connector circuit 1112. In the case where the Tx port 1100 is utilized to transmit data to the Rx port over a fiber optic cable, the ASIC/FPGA 1106 and the Tx-PHY 1108 may be incorporated into a single circuit 1114. In the case where the Tx port 1100 is utilized to transmit data to the Rx port over a copper connection (e.g., cat5, cat5e, cat 6, etc.) then the Tx-PHY 1108 and the ASIC/FPGA 1106 may be separate circuits as shown. The Tx port 1100 receives a multimedia signal data input 1116 and outputs, among other things, a multimedia signal output 1118.

Exemplary Rx Port

Figure 12:
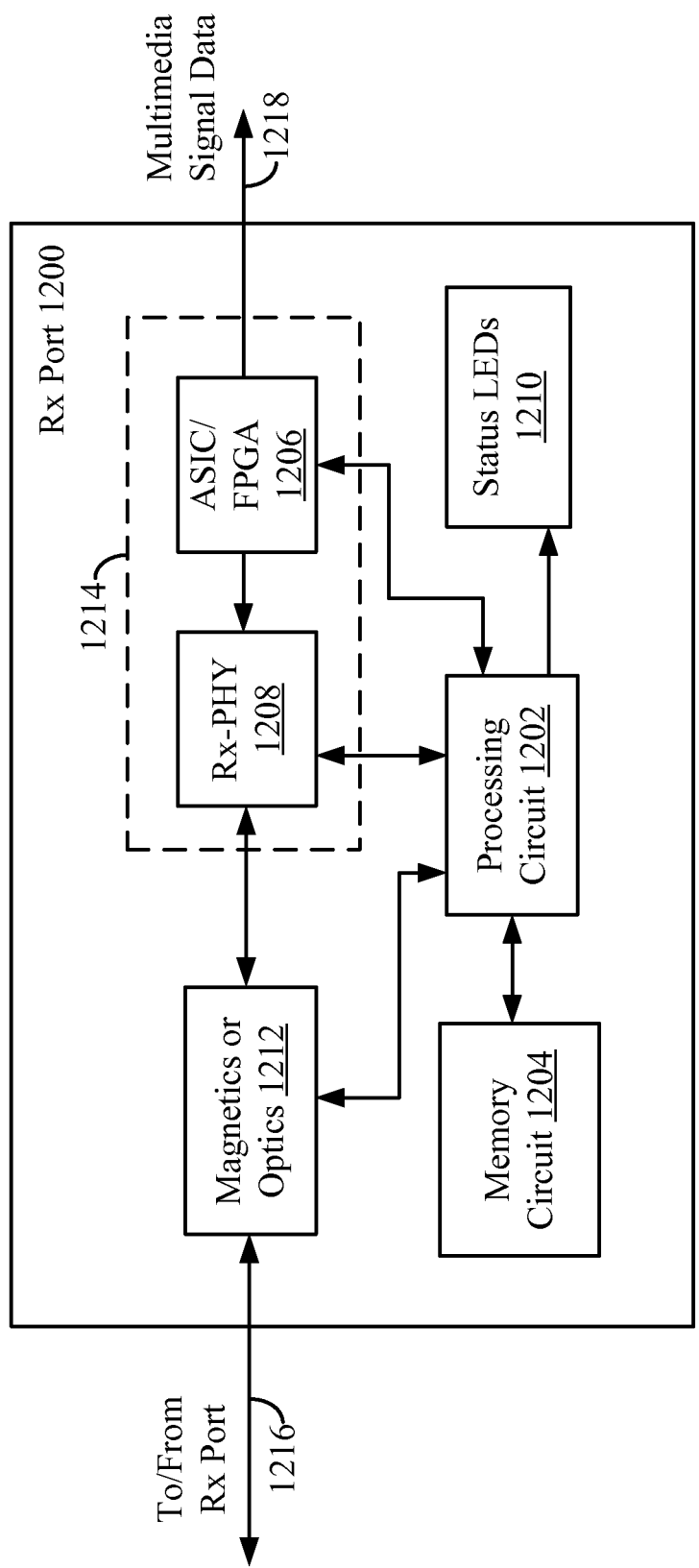
FIG. 12 illustrates a second exemplary schematic block diagram of an Rx port.

FIG. 12 illustrates a block diagram of the Rx port 1200 according to one aspect of the disclosure. The Rx port 1200 may include a processing circuit 1202, a memory circuit 1204, an application specific integrated circuit (ASIC) or a field-programmable gate array (FPGA) 1206, a Tx physical layer circuit (PHY) 1208, status LEDs 1210, and/or a magnetics/optics connector circuit 1212. In the case where the Rx port 1200 is utilized to transmit data to the Tx port over a fiber optic cable, the ASIC/FPGA 1206 and the Rx-PHY 1208 may be incorporated into a single circuit 1214. In the case where the Rx port 1200 is utilized to transmit data to the Tx port over a copper connection (e.g., cat5, cat5e, cat 6, etc.) then the Rx-PHY 1208 and the ASIC/FPGA 1206 may be separate circuits as shown. The Rx port 1200 receives a multimedia signal data input 1216 from the Tx port and outputs a multimedia signal output 1218 to a destination device.

Exemplary Method

Figure 13:
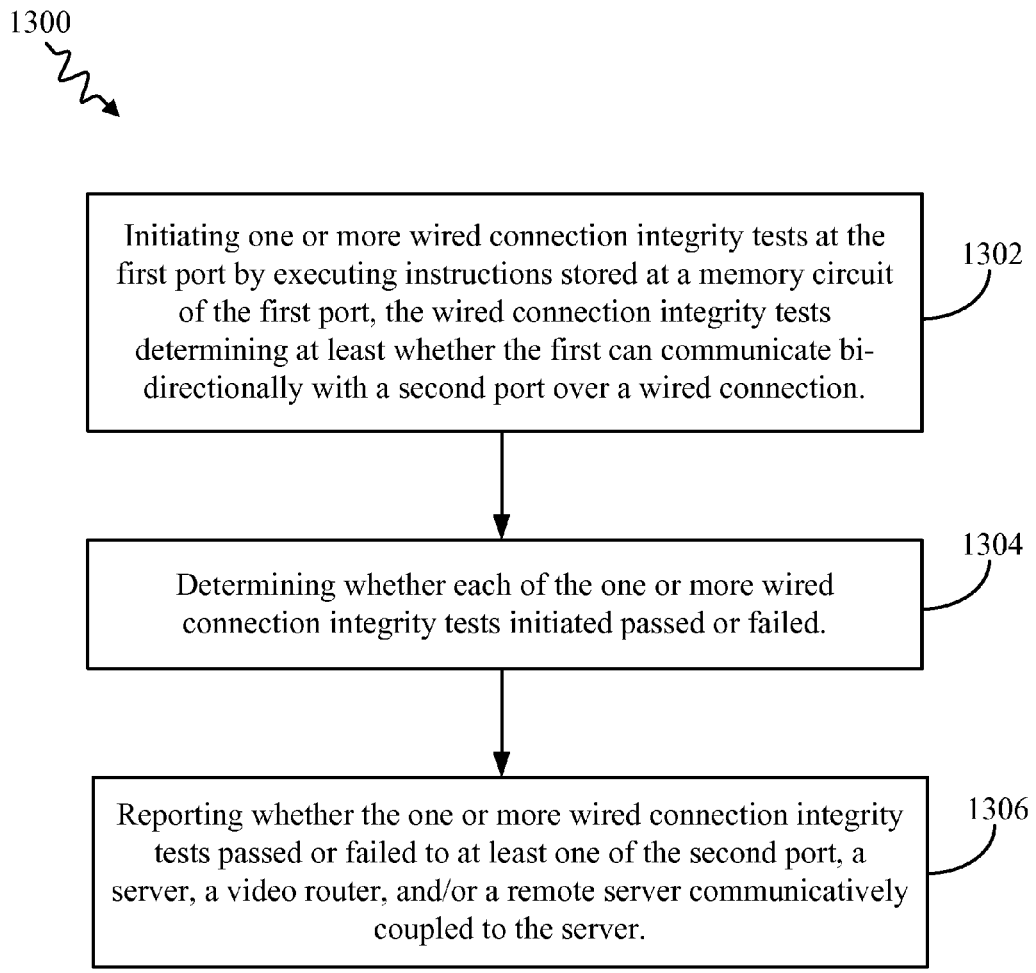
FIG. 13 illustrates a flow chart for a method operational at a first port.

FIG. 13 illustrates a flow chart for a method 1300 operational at a first port (e.g., Tx port 200 or Rx port 300) according to one aspect. First, one or more wired connection integrity tests may be initiated 1302 at the first port by executing instructions stored at a memory circuit of the first port, where the wired connection integrity tests determine at least whether the first port can communicate bi-directionally with a second port (corresponding Rx port 300 or Tx port 200) over a wired connection. Next, whether each of the one or more wired connection integrity tests initiated passed or failed may be determined 1304. Then, whether the one or more wired connection integrity tests passed or failed may be reported 1306 to at least one of the second port, a server, a video router, and/or a remote server communicatively coupled to the server.

One or more of the components, steps, features, and/or functions illustrated in FIGS. 1, 2, 3, 4, 5, 6, 7, 8, 9, 10, 11,

12, and/or 13, may be rearranged and/or combined into a single component, step, feature or function or embodied in several components, steps, or functions. Additional elements, components, steps, and/or functions may also be added without departing from the invention. The apparatus, devices, and/or components illustrated in FIGS. 1, 2, 3, 4, 11, and/or 12 may be configured to perform one or more of the methods, features, or steps described in FIGS. 5, 6, 7, 8, 9, 10, and/or 13. The algorithms described herein may also be efficiently implemented in software and/or embedded in hardware.

Moreover, in one aspect of the disclosure, the processing circuit 202 illustrated in FIG. 2 may be a specialized processor (e.g., an application specific integrated circuit (e.g., ASIC)) that is specifically designed and/or hard-wired to perform the algorithms, methods, and/or steps described in FIGS. 5, 6, 7, 8, 9, 10, and/or 13 and related text. Thus, such a specialized processor (e.g., ASIC) may be one example of a means for executing the algorithms, methods, and/or steps described in FIGS. 5, 6, 7, 8, 9, 10, and/or 13. Similarly, in one aspect of the disclosure, the processing circuit 302 illustrated in FIG. 3 may be a specialized processor (e.g., an application specific integrated circuit (e.g., ASIC)) that is specifically designed and/or hard-wired to perform the algorithms, methods, and/or steps described in FIGS. 5, 6, 7, 8, 9, 10, and/or 13 and related text. Thus, such a specialized processor (e.g., ASIC) may be one example of a means for executing the algorithms, methods, and/or steps described in FIGS. 5, 6, 7, 8, 9, 10, and/or 13

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing or containing instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
a first communication interface;
a second communication interface configured to transmit and/or receive multimedia data signals to and/or from a device through a wired connection;
a memory circuit configured to store instructions for conducting one or more wired connection integrity tests, the wired connection integrity tests determining at least whether the apparatus is able to communicate with the device, and the one or more wired connection integrity tests includes a video test pattern test that determines whether the device is accurately receiving video data signals from the apparatus through the wired connection; and
a processing circuit communicatively coupled to the first and second communication interfaces and the memory circuit, the processing circuit configured to:
initiate the one or more wired connection integrity tests by executing the instructions stored in the memory circuit;
determine whether each of the one or more wired connection integrity tests initiated passed or failed;
report whether the one or more wired connection integrity tests passed or failed;
transmit a video test pattern (VTP) request message to the device indicating a specific video test pattern is requested;
receive a device-generated video test pattern from the device through the wired connection;
obtain an apparatus-generated video test pattern that is generated at the apparatus based on the specific video test pattern requested;
compare the device-generated video test pattern received to the apparatus-generated video test pattern;
determine a match value indicative of how closely the device-generated video test pattern received matches the apparatus-generated video test pattern; and
report a video test pattern failed message when the match value is less than a predefined threshold value.

2. The apparatus of claim 1, wherein the one or more wired connection integrity tests include a signal line communication (SLC) test that determines whether the apparatus and the device are able to establish bi-directional communications with each other, and the processing circuit is further configured to:
initiate the SLC test;
transmit a SLC test request message to the device;
determine that the SLC test passed if a SLC test acknowledgement message is received in response to the SLC test message from the device within a predefined period of time, otherwise determine that the SLC test failed; and
report whether the SLC test passed or failed.

3. The apparatus of claim 1, wherein the one or more wired connection integrity tests include a cable integrity and quality (CIQ) test that determines whether there exists at least one of (a) an increase in power loss associated with the wired connection, and/or (b) a power loss value associated with the wired connection exceeds a predefined threshold value.

4. The apparatus of claim 1, wherein the one or more wired connection integrity tests include a cable integrity and quality (CIQ) test, and the processing circuit is further configured to:
generate a first test sequence;
transmit the first test sequence to the device through the wired connection;
receive a second test sequence;
determine a transmit power of the first test sequence and receive power of the second test sequence;
receive a transmit power of the second test sequence and a receive power of the first test sequence from the device;
determine one or more power loss values associated with the wired connection based on the transmit power of the first test sequence, the receive power of the first test sequence, the transmit power of the second test sequence, and the receive power of the second test sequence; and
determine whether the one or more power loss values exceeds a predefined threshold value and if so then report a CIQ test failed message.

5. The apparatus of claim 4, wherein the CIQ test failed message is reported to at least one of (a) a server and video router (SVR) communicatively coupled to the apparatus and/or the device, and/or (b) a remote server communicatively coupled to the SVR through a communication network.

6. The apparatus of claim 4, the processing circuit is further configured to:
compare the one or more power loss values to stored power loss values generated during prior CIQ tests; and
determine whether the one or more power loss values is indicative of a greater power loss through the wired connection than the stored power loss values generated during prior CIQ tests.

7. The apparatus of claim 1, wherein the video test pattern test includes a video test pattern, and the first communication interface is configured to transmit the video test pattern to a display device where the video test pattern can be visually inspected on the display device to determine whether the display device is accurately received video signals from the apparatus.

8. The apparatus of claim 1, wherein the first communication interface is configured to receive a first multimedia data signal from at least one of a multimedia data source and/or a multimedia data converter, and the second communication interface is configured to transmit a second multimedia data signal to the device, the second multimedia data signal based on the first multimedia data signal.

9. The apparatus of claim 1, wherein the second communication interface is configured to receive a first multimedia data signal from the device, and the first communication interface is configured to transmit a second multimedia data signal to a multimedia destination device, the second multimedia data signal based on the first multimedia data signal.

10. The apparatus of claim 1, further comprising:
an input device configured to receive a selection from a user;
one or more light emitting diode (LED) status indicators; and
wherein the processing circuit is further configured to:
initiate the one or more wired connection integrity tests after receiving the selection from the input device; and
report whether the one or more wired connection integrity tests passed or failed by illuminating the one or more LED status indicators.

11. The apparatus of claim 1, wherein the processing circuit is further configured to:

receive a command from a server and video router (SVR) and/or a remote server that initiates the one or more wired connection integrity tests; and report whether the one or more wired connection integrity tests passed or failed to the SVR and/or the remote server.

12. The apparatus of claim 1, wherein the one or more wired connection integrity tests are initiated according to a predefined schedule.

13. The apparatus of claim 1, wherein the processing circuit is further configured to:

receive a command from a server and video router (SVR) and/or a remote server that initiates the video test pattern test; and report the video test pattern failed message or a video test pattern success message to the SVR and/or the remote server.

14. A system comprising:
a Transmit (Tx) port;
a Receive (Rx) port;
a wired connection communicatively coupling the Tx port to the Rx port and allowing bi-directional communication between the Tx port and the Rx port;
wherein the Tx port and/or the Rx port are configured to
initiate one or more wired connection integrity tests, the wired connection integrity tests determining at least whether the Tx port and the Rx port can communicate with one another, the one or more wired connection integrity tests including a video test pattern test that determines whether the Rx port is accurately receiving video data signals from the Tx port through the wired connection,
determine whether each of the one or more wired connection integrity tests initiated passed or failed,
report whether the one or more wired connection integrity tests passed or failed; and
wherein the Rx port is configured to
transmit a video test pattern (VTP) request message to the Tx port indicating a specific video test pattern is requested,
receive a Tx port-generated video test pattern from the Tx port through the wired connection,
obtain an Rx port-generated video test pattern that is generated at the Rx port based on the specific video test pattern requested,
compare the Tx port-generated video test pattern received to the Rx port-generated video test pattern,
determine a match value indicative of how closely the Tx port-generated video test pattern received matches the Rx port-generated video test pattern, and
report a video test pattern failed message when the match value is less than a predefined threshold value.

15. The system of claim 14, wherein the one or more wired connection integrity tests include a signal line communication (SLC) test that determines whether the Tx port and the Rx port are able to establish bi-directional communications with each other, and at least one of the Tx port and/or the Rx port is configured to:

initiate the SLC test;
transmit a SLC test request message;
determine that the SLC test passed if a SLC test acknowledgement message is received in response to the SLC test message within a predefined period of time, otherwise determine that the SLC test failed; and
report whether the SLC test passed or failed.

16. The system of claim 14, wherein the one or more wired connection integrity tests include a cable integrity and quality (CIQ) test that determines whether there exists at least one of (a) an increase in power loss associated with the wired connection, and/or (b) a power loss value associated with the wired connection exceeds a predefined threshold value.

17. The system of claim 14, wherein the Tx port is configured to receive a first multimedia data signal from at least one of a multimedia data source and/or a multimedia data converter, and the Rx port is configured to transmit a second multimedia data signal to a video router that is communicatively coupled to the Rx port, the second multimedia data signal based on the first multimedia data signal.

18. The system of claim 14, wherein the Tx port is configured to receive a first multimedia data signal from a video router that is communicatively coupled to the Tx port, and the Rx port is configured to transmit a second multimedia data signal to a multimedia destination device, the second multimedia data signal based on the first multimedia data signal.

19. The system of claim 14, wherein the Rx port is further configured to:

receive a command from a server and video router (SVR) and/or a remote server that initiates the video test pattern test; and
report the video test pattern failed message or a video test pattern success message to the SVR and/or the remote server.

20. A method operational at a first port, the method comprising:

initiating a video test pattern test at the first port by executing instructions stored at a memory circuit of the first port, the video test pattern test determining whether the first port is accurately receiving video data signals from a second port over a wired connection;
transmit a video test pattern (VTP) request message from the first port to the second port indicating a specific video test pattern is requested;
receive a second port-generated video test pattern from the second port through the wired connection;
obtain a first port-generated video test pattern that is generated at the first port based on the specific video test pattern requested;
compare the second port-generated video test pattern received to the first port-generated video test pattern;
determine a match value indicative of how closely the second port-generated video test pattern received matches the first port-generated video test pattern; and
report a video test pattern failed message to a video signal router when the match value is less than a predefined threshold value.

* * * * *